(12) United States Patent
Yoshida et al.

(10) Patent No.: US 11,463,039 B2
(45) Date of Patent: Oct. 4, 2022

(54) ENERGY HARVESTER

(71) Applicant: ZEON CORPORATION, Tokyo (JP)

(72) Inventors: Masayoshi Yoshida, Tokyo (JP); Kiyoshige Kojima, Tokyo (JP); Yuki Hayashi, Tokyo (JP); Takatoshi Matsuo, Tokyo (JP); Midori Yamaai, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 127 days.

(21) Appl. No.: 16/647,522

(22) PCT Filed: Sep. 13, 2018

(86) PCT No.: PCT/JP2018/033950
§ 371 (c)(1),
(2) Date: Mar. 16, 2020

(87) PCT Pub. No.: WO2019/065265
PCT Pub. Date: Apr. 4, 2019

(65) Prior Publication Data
US 2020/0220491 A1 Jul. 9, 2020

(30) Foreign Application Priority Data
Sep. 29, 2017 (JP) .............................. JP2017-189981

(51) Int. Cl.
*H02S 10/40* (2014.01)
*H02S 40/34* (2014.01)
(Continued)

(52) U.S. Cl.
CPC ........... *H02S 10/40* (2014.12); *H01G 9/2059* (2013.01); *H01G 9/2081* (2013.01);
(Continued)

(58) Field of Classification Search
CPC .......... H02S 30/10; H02S 20/23; H02S 40/34; H02S 40/345; H02S 40/36; F16K 3/184;
(Continued)

(56) References Cited

U.S. PATENT DOCUMENTS

2003/0193322 A1* 10/2003 Higashikozono ..... H02S 40/345
323/299
2010/0311262 A1* 12/2010 Cours .................... H01R 24/66
439/281
(Continued)

FOREIGN PATENT DOCUMENTS

JP     2003179247 A    6/2003
JP     2006024777 A    1/2006
(Continued)

OTHER PUBLICATIONS

May 27, 2021, the Extended European Search Report issued by the European Patent Office in the corresponding European Patent No. 18861502.5.
(Continued)

Primary Examiner — Michael Y Sun
(74) Attorney, Agent, or Firm — Kenja IP Law PC

(57) ABSTRACT

Provided is an energy harvester having excellent portability. The energy harvester includes a flat plate-shaped energy harvesting section and a pair of connectors that are electrically conductive. The energy harvesting section includes an electricity generating region that utilizes energy in the external environment to generate electrical power and metal foils. The metal foils extend from the electricity generating region to a peripheral part of the energy harvesting section. The electrical power of the electricity generating region is supplied to the metal foils. The peripheral part includes a pair of holes that expose part of each of the metal foils. Each of the connectors includes a spring, a terminal part that is electrically connected to the spring and is connectable to an
(Continued)

external device, and a flat plate part that overlaps with the energy harvesting section. The springs are electrically connected to the metal foils exposed via the holes.

13 Claims, 19 Drawing Sheets

(51) Int. Cl.
- *H01G 9/20* (2006.01)
- *H01L 35/32* (2006.01)
- *H02N 2/18* (2006.01)
- *H01L 41/113* (2006.01)

(52) U.S. Cl.
CPC ........... *H01G 9/2095* (2013.01); *H01L 35/32* (2013.01); *H02N 2/186* (2013.01); *H02S 40/34* (2014.12); *H01G 9/20* (2013.01); *H01L 41/113* (2013.01); *Y02E 10/542* (2013.01)

(58) Field of Classification Search
CPC . F16K 3/186; F16K 3/205; F16K 7/06; F16K 7/16; H01R 4/4827; H01R 4/4836; H01R 4/4845; H01R 4/4854; H01R 4/4863; H01R 4/4872; Y02B 10/10; Y02B 10/20; F24S 25/634; F24S 2025/6004; F24S 2025/801; F24S 25/20; F24S 25/33; F24S 25/632; Y02E 10/47; Y02E 10/50
See application file for complete search history.

(56) References Cited

U.S. PATENT DOCUMENTS

| 2011/0220168 | A1* | 9/2011 | Park | H01L 31/05 |
| | | | | 136/244 |
| 2011/0253192 | A1* | 10/2011 | Wang | H02S 40/34 |
| | | | | 136/244 |
| 2012/0216849 | A1* | 8/2012 | Cho | H01L 31/042 |
| | | | | 136/244 |
| 2015/0129012 | A1* | 5/2015 | Park | H02S 40/36 |
| | | | | 136/244 |

FOREIGN PATENT DOCUMENTS

| WO | 2013005770 A1 | 1/2013 |
| WO | 2016163121 A1 | 10/2016 |

OTHER PUBLICATIONS

Dec. 18, 2018, International Search Report issued in the International Patent Application No. PCT/JP2018/033950.

Mar. 31, 2020, International Preliminary Report on Patentability issued in the International Patent Application No. PCT/JP2018/033950.

\* cited by examiner

FIG. 10
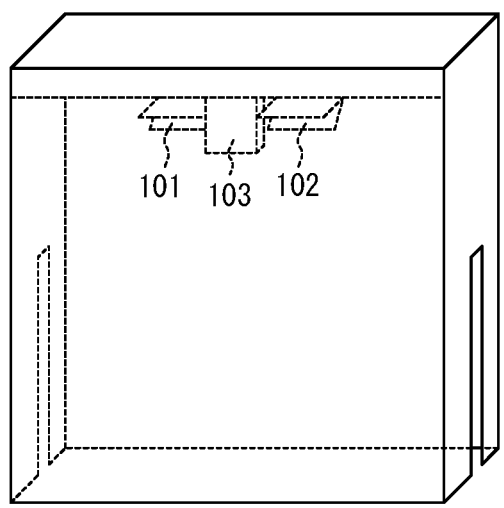
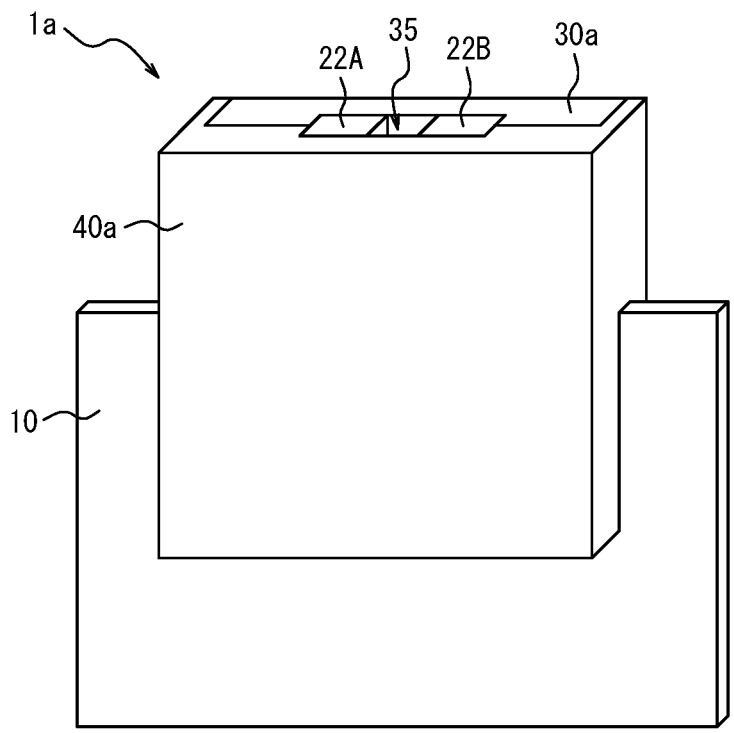

FIG. 12
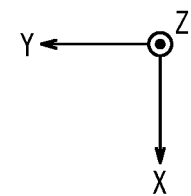
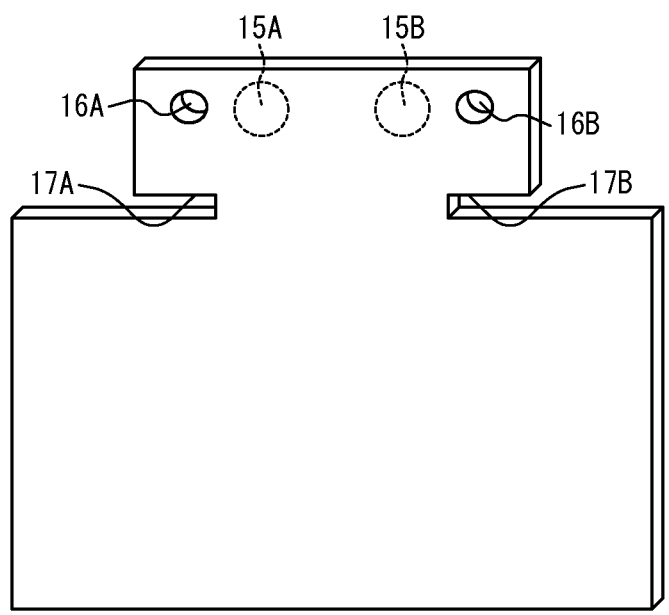
FIG. 13
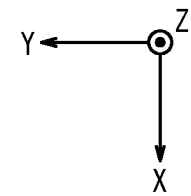
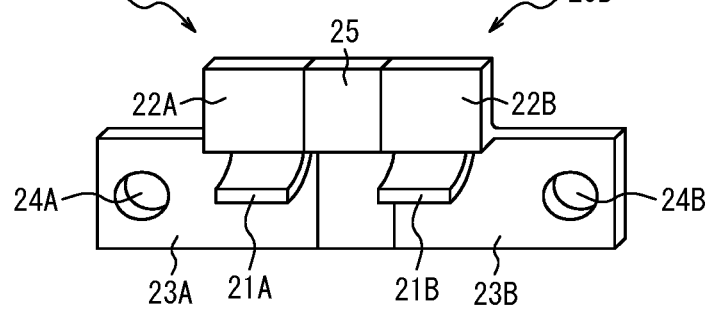

ENERGY HARVESTER

TECHNICAL FIELD

The present disclosure relates to an energy harvester.

BACKGROUND

Energy harvesting devices that utilize energy in the external environment to generate electricity are conventionally known. Examples of energy harvesting devices include devices that utilize sunlight to generate electricity, devices that utilize vibration to generate electricity, and devices that utilize geothermal energy to generate electricity.

In recent years, there has been increasing demand for portable energy harvesting devices that enable users to use electrical power even when they go out, for example, and do not have access to an electrical power supply from a commercial power supply.

In one example, Patent Literature (PTL) 1 discloses a portable solar cell power supply that includes a solar cell module, a portable power supply main body to which the solar cell module is detachably connected, and a connecting member. In a portable solar cell power supply such as described above, electrical power generated by the solar cell module is supplied to an external electrical device via the connecting member.

CITATION LIST

Patent Literature

PTL 1: JP 2006-24777 A

SUMMARY

Technical Problem

However, in the case of the portable solar cell power supply disclosed in the PTL 1, the connecting member is provided in the portable power supply main body, which is a separate body to the solar cell module. This leads to an increase in size of the overall portable solar cell power supply in PTL 1 and may result in loss of portability of the portable solar cell power supply.

Accordingly, an objective of the present disclosure is to solve the problem set forth above and provide an energy harvester that has excellent portability.

Solution to Problem

The present disclosure aims to advantageously solve the problem set forth above by disclosing an energy harvester comprising: an energy harvesting section having a flat plate shape; and a pair of connectors that are electrically conductive, wherein the energy harvesting section includes: an electricity generating region that utilizes energy in an external environment to generate electrical power; and a pair of metal foils that extend from the electricity generating region to a peripheral part of the energy harvesting section and to which the electrical power is supplied, the peripheral part includes a pair of holes that expose part of each of the metal foils, and each of the connectors includes: a spring that is electrically connected to a corresponding one of the metal foils exposed via a corresponding one of the holes; a terminal part that is electrically connected to the spring and is connectable to an external device; and a flat plate part that overlaps with the energy harvesting section. Through this configuration, the flat plate parts of the connectors overlap with the peripheral part of the flat plate-shaped energy harvesting section, and thus the energy harvesting section and the connectors are unified. Consequently, an increase in thickness of the energy harvester can be suppressed and the energy harvester can be provided with excellent portability. Moreover, when the energy harvesting section and the connectors are unified and fixed together, the respective springs of the pair of connectors are pressed against by the metal foils of the energy harvesting section. This can increase contact strength between the springs and the metal foils and can increase the reliability of conductive connection between the energy harvesting section and the connectors.

The present disclosure also aims to advantageously solve the problem set forth above by disclosing an energy harvester comprising: an energy harvesting section having a flat plate shape and including an electricity generating region that utilizes energy in an external environment to generate electrical power; a pair of connectors that are electrically conductive; and a flexible printed circuit including a pair of metal foils that extend from the electricity generating region to a peripheral part of the energy harvesting section and to which the electrical power is supplied, wherein the peripheral part includes a pair of holes that expose part of each of the metal foils, and each of the connectors includes: a spring that is electrically connected to a corresponding one of the metal foils exposed via a corresponding one of the holes; a terminal part that is electrically connected to the spring and is connectable to an external device; and a flat plate part that overlaps with the energy harvesting section. Through this configuration, the flat plate parts of the connectors overlap with the peripheral part of the flat plate-shaped energy harvesting section, and thus the energy harvesting section and the connectors are unified. Consequently, an increase in thickness of the energy harvester can be suppressed and the energy harvester can be provided with excellent portability. Moreover, when the energy harvesting section and the connectors are unified and fixed together, the respective springs of the pair of connectors are pressed against by the metal foils of the pair of flexible printed circuits. This can increase contact strength between the springs and the metal foils and can increase the reliability of conductive connection between the energy harvesting section and the pair of connectors.

The presently disclosed energy harvester may further comprise a diode arranged on the flexible printed circuit, wherein one of the metal foils includes a first metal foil and a second metal foil, one end part of the first metal foil is electrically connected to a positive electrode side of the electricity generating region and another end part of the first metal foil is electrically connected to an anode of the diode, and one end part of the second metal foil is electrically connected to a cathode of the diode and another end part of the second metal foil is exposed via the hole and is electrically connected to the spring. By arranging the diode on the flexible printed circuit, the degree of freedom of arrangement position of the diode can be increased. This configuration enables size reduction of the energy harvester.

In the presently disclosed energy harvester, the energy harvesting section preferably includes, separately to the electricity generating region, an arrangement region where the flat plate part is arranged. In a case in which the electricity generating part includes a solar cell, for example, this configuration can prevent a situation in which sunlight is unable to reach the electricity generating part due to the connectors.

In the presently disclosed energy harvester, the peripheral part is preferably included in a protruding part that protrudes from the electricity generating region. Through this configuration, infiltration of moisture to the electricity generating part from holes in the protruding part can be prevented.

In the presently disclosed energy harvester, the spring, the terminal part, and the flat plate part are preferably formed as a unified body. When the spring, the terminal part, and the flat plate part are formed as a unified body in this manner, the production process of the connectors can be simplified.

In the presently disclosed energy harvester, the terminal part preferably has a larger thickness than the flat plate part. When the terminal part has a larger thickness in this manner, the strength of the terminal part can be increased.

In the presently disclosed energy harvester, it is preferable that a plane that passes along a center line of a thickness direction of the terminal part and is perpendicular to the thickness direction and a plane that passes along a center line of a thickness direction of the energy harvesting section and is perpendicular to the thickness direction roughly coincide. This configuration can prevent deformation and damage of the energy harvester by external force when external force acts on the energy harvester.

In the presently disclosed energy harvester, it is preferable that a surface that passes through a center of gravity of the energy harvesting section having a flat plate shape and is roughly parallel to the energy harvesting section and a surface that passes through a center of gravity of the terminal part and is perpendicular to a thickness direction of the terminal part are roughly the same. In a case in which a center line of the shape of the terminal part or the energy harvesting section cannot be simply identified, this configuration can prevent deformation and damage of the energy harvester by external force when external force acts on the energy harvester.

In the presently disclosed energy harvester, it is preferable that in a cross-section that is roughly parallel to an insertion/extraction direction in which the terminal part is inserted or extracted and is perpendicular to the energy harvesting section having a flat plate shape, a center line of a thickness direction of the terminal part and a center line of a thickness direction of the energy harvesting section roughly coincide and are roughly parallel to the insertion/extraction direction. This configuration can prevent force from acting on the energy harvester in a direction other than the insertion/extraction direction when the energy harvester is inserted into or extracted from an external device. Consequently, deformation and damage of the energy harvester can be prevented.

In the presently disclosed energy harvester, it is preferable that a surface that passes through a center of gravity of the energy harvesting section having a flat plate shape and is roughly parallel to the energy harvesting section and a surface that passes through a center of gravity of the terminal part and is perpendicular to a thickness direction of the terminal part are roughly the same and are roughly parallel to an insertion/extraction direction in which the terminal part is inserted or extracted. In a case in which a center line of the shape of the terminal part or the flat plate-shaped energy harvesting section cannot be simply identified, this configuration can prevent force from acting on the energy harvester in a direction other than the insertion/extraction direction when the energy harvester is inserted into or extracted from an external device. Consequently, deformation and damage of the energy harvester can be prevented.

The presently disclosed energy harvester preferably further comprises: a first housing including a pair of projecting parts; and a second housing including a pair of fitting parts into which the projecting parts respectively fit, wherein the first housing and the second housing sandwich the peripheral part and the connectors, the peripheral part includes a pair of first penetrations through which the projecting parts are respectively inserted, and the flat plate part includes a second penetration through which a corresponding one of the projecting parts is inserted. Through this configuration, the pair of connectors and the energy harvesting section can be collectively unified through the projecting parts and the projecting parts can be fixed to the flat plate parts.

In the presently disclosed energy harvester, at least one of the first housing and the second housing preferably has a shape or member that is dependent on an external device. Through this configuration, it is possible to provide an improved energy harvester.

In the presently disclosed energy harvester, an electrical insulator is preferably arranged between the terminal parts of the connectors. Through this configuration, short-circuiting between the two terminal parts can be prevented.

In the presently disclosed energy harvester, the electricity generating region preferably includes a dye-sensitized solar cell. A dye-sensitized solar cell is easy to shape thinly. Therefore, this configuration enables thickness reduction and size reduction of the energy harvesting section.

Advantageous Effect

According to the present disclosure, it is possible to provide an energy harvester having excellent portability.

BRIEF DESCRIPTION OF THE DRAWINGS

In the accompanying drawings:

FIG. 10 illustrates an example of the energy harvester illustrated in FIG. 9A being inserted into a female connector serving as an external device;

FIG. 12 illustrates a third modified example of the energy harvester illustrated in FIG. 1;

FIG. 13 illustrates a fourth modified example of the energy harvester illustrated in FIG. 1;

DETAILED DESCRIPTION

Figure 1:
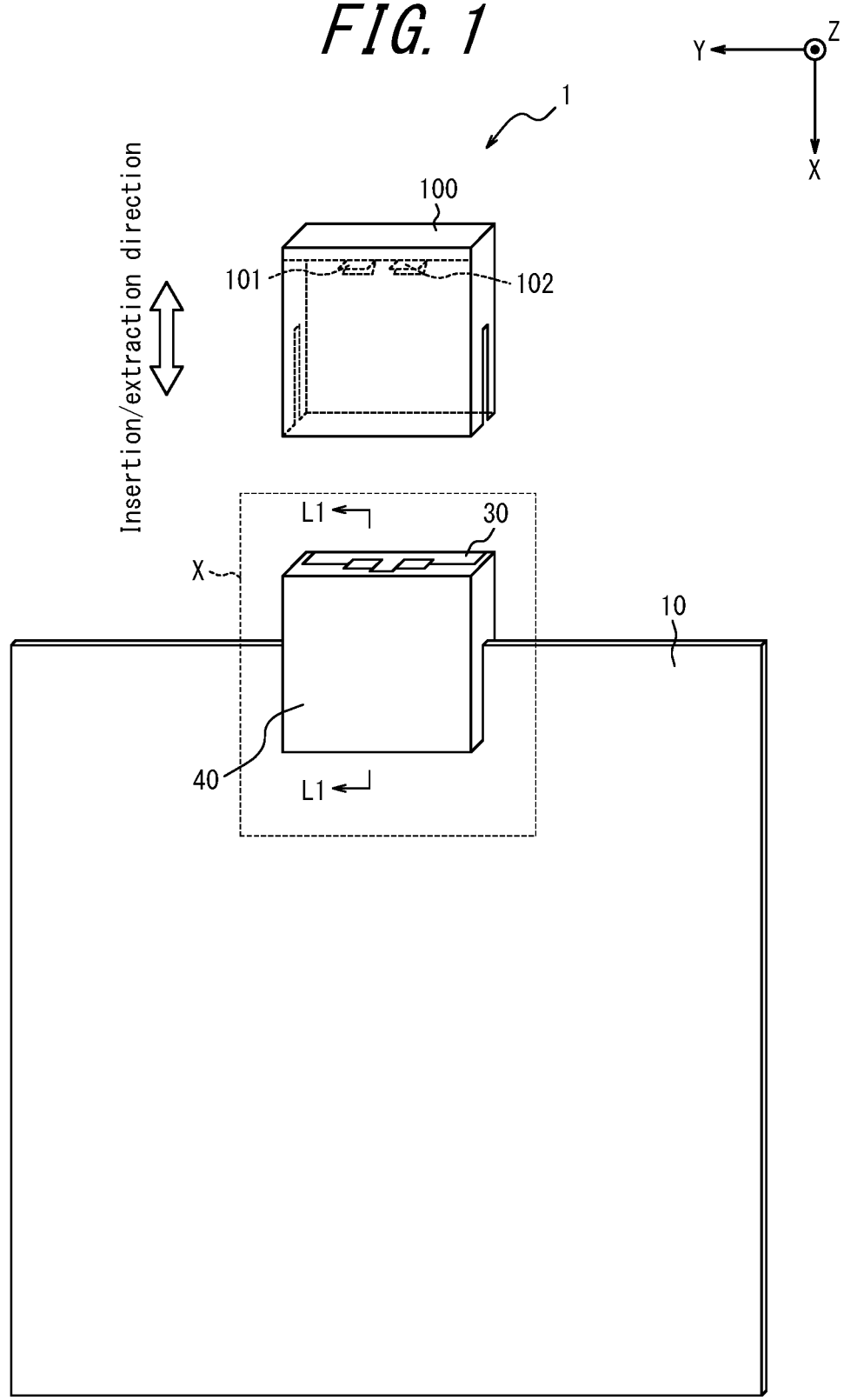
FIG. 1 illustrates schematic configuration of an energy harvester according to a first embodiment of the present disclosure.

The following provides a description of embodiments according to the present disclosure with reference to the drawings. Note that common constituent elements in the drawings are allotted the same reference sign. Also note that the insertion/extraction direction referred to in the present specification is a direction that is a combination of a positive X-axis direction and a negative X-axis direction illustrated in FIG. 1, etc.

First Embodiment

The following describes an energy harvester according to a first embodiment of the present disclosure with reference to FIGS. 1 to 13. In the first embodiment, the configuration of the energy harvester is mainly described.

[Configuration of Energy Harvester]

FIG. 1 illustrates schematic configuration of an energy harvester 1 according to the first embodiment of the present disclosure. The energy harvester 1 utilizes energy in the external environment to generate electricity. Examples of energy in the external environment include sunlight, vibration, and geothermal energy. The energy harvester 1 can supply generated electrical power to an external device. A female connector 100 illustrated in FIG. 1 is one example of an external device. The female connector 100 includes a positive electrode terminal 101 and a negative electrode terminal 102.

In the following description, the state in which the energy harvester 1 is illustrated in FIG. 1 is referred to as an "assembled state".

Figure 2:
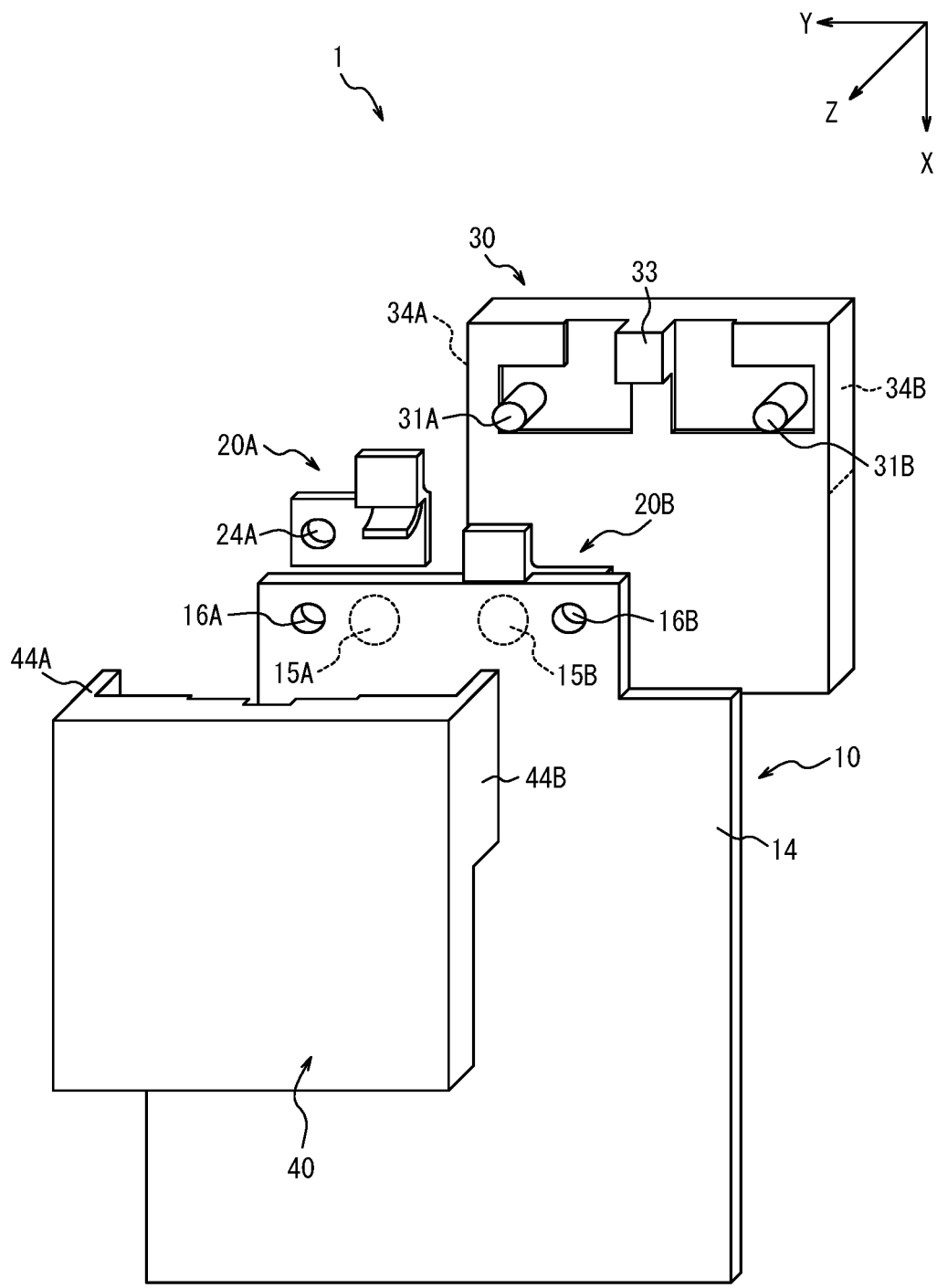
FIG. 2 is an exploded perspective view of a dotted line section X, illustrated in FIG. 1, of the energy harvester according to the first embodiment of the present disclosure.
Figure 3:
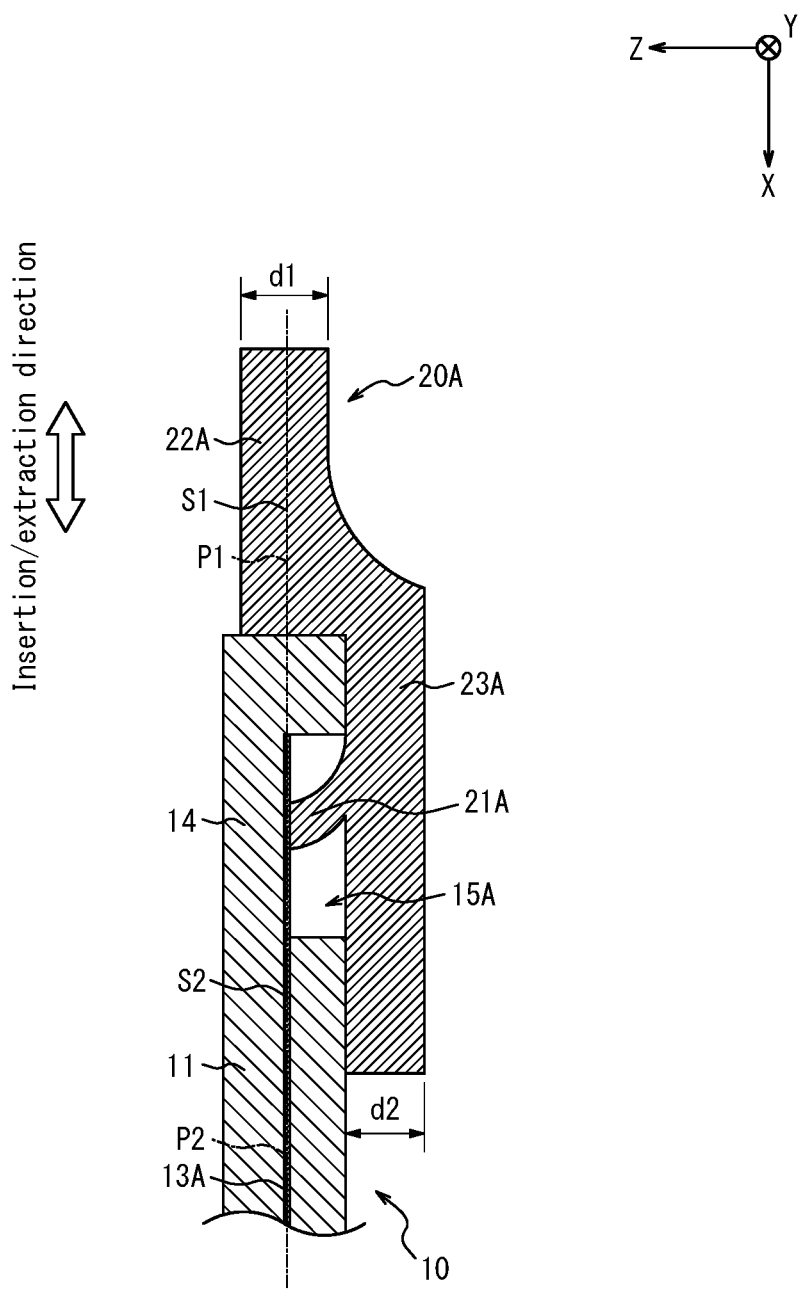
FIG. 3 is a cross-sectional view at an L1-L1 line of the energy harvester illustrated in FIG. 1.

FIG. 2 is an exploded perspective view of a dotted line section X of the energy harvester 1 illustrated in FIG. 1. FIG. 3 is a cross-sectional view at an L1-L1 line of the energy harvester 1 illustrated in FIG. 1. The energy harvester 1 includes an energy harvesting section 10 and a pair of connectors 20A and 20B as illustrated in FIGS. 2 and 3. The energy harvester 1 may further include a first housing 30 and a second housing 40 depending on the application of the energy harvester 1.

The following describes configuration of the energy harvesting section 10, the connectors 20A and 20B, the first housing 30, and the second housing 40 with reference to FIGS. 4 to 8.

[Energy Harvesting Section]

Figure 4:
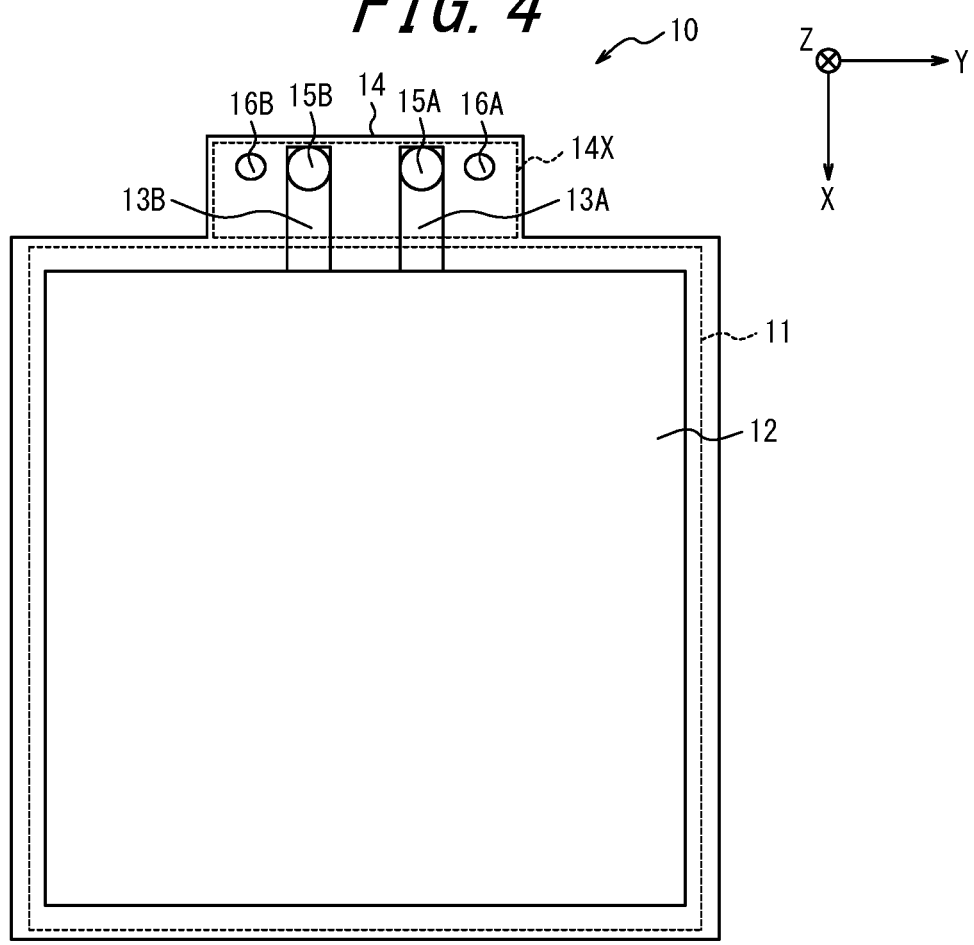
FIG. 4 illustrates schematic configuration of an energy harvesting section according to the first embodiment of the present disclosure.

FIG. 4 illustrates schematic configuration of the energy harvesting section 10 according to the first embodiment of the present disclosure. In terms of external appearance, the energy harvesting section 10 has a flat plate shape. The term "flat plate shape" refers to a shape that, relative to a thickness direction, is sufficiently large in a horizontal plane direction perpendicular to the thickness direction. The energy harvesting section 10 may be flexible. The energy harvesting section 10 includes an electricity generating region 11 and a pair of metal foils 13A and 13B. In addition, the energy harvesting section 10 may include an arrangement region 14X. The energy harvesting section 10 may also include a protruding part 14. However, note that the energy harvesting section 10 may alternatively not include a protruding part 14. An example in which the energy harvesting section 10 does not include a protruding part 14 is described further below in a third embodiment.

Note that the term "peripheral part of the energy harvesting section" as used in the present specification refers to an edge part at a side located at a negative X-axis direction side of the energy harvesting section. In the first embodiment, the "peripheral part of the energy harvesting section 10" is included in the protruding part 14. Note that the "peripheral part of the energy harvesting section 10" may be the entire protruding part 14 or may be a negative X-axis direction portion of the protruding part 14. In the following description, the "peripheral part of the energy harvesting section 10" is considered to be the entire protruding part 14.

The electricity generating region 11 includes an electricity generating part 12. The electricity generating part 12 utilizes energy in the external environment to generate electricity. In addition to the electricity generating part 12, the electricity generating region 11 can include wiring (hereinafter, referred to as "leader wiring") for leading electrical power generated by the electricity generating part 12, out from the electricity generating part 12, for example.

In a case in which sunlight is utilized as energy in the external environment, for example, the electricity generating part 12 may include a solar cell that converts sunlight to electrical power. Types of solar cells that can be used as the electricity generating part 12 are broadly classified into inorganic solar cells in which inorganic materials are used and organic solar cells in which organic materials are used. Examples of inorganic solar cells include silicon (Si) solar cells in which silicon is used and compound solar cells in which a compound is used. Examples of organic solar cells include thin-film solar cells such as small molecule vapor deposition-type solar cells in which an organic pigment is used, polymer coating-type solar cells in which a conductive polymer is used, and coating-conversion-type solar cells in which a conversion-type semiconductor is used; and dye-sensitized solar cells formed from titania, an organic dye, and an electrolyte. Examples of solar cells that can be used as the electricity generating part 12 also include organic/inorganic hybrid solar cells and solar cells in which a perovskite compound is used. A dye-sensitized solar cell that can be produced in a plastic film or the like can suitably be used as a solar cell according to the present embodiment. An example in which the electricity generating part 12 is configured using dye-sensitized solar cells is described further below in a second embodiment.

In a case in which vibration is utilized as energy in the external environment, for example, the electricity generating part 12 may include a piezoelectric element that converts vibration to electrical power. Moreover, in a case in which geothermal energy is utilized as energy in the external environment, for example, the electricity generating part 12 may include a thermoelectric element that converts heat to electrical power.

The arrangement region 14X is a separate region to the electricity generating region 11. A flat plate part 23A of the connector 20A illustrated in FIG. 2 and a flat plate part 23B of the connector 20B illustrated in FIG. 2 are arranged in the arrangement region 14X. The arrangement region 14X may be adjacent to the electricity generating region 11.

The metal foils 13A and 13B are each a metal in the form of a foil of 300 μm or less in thickness, for example. Copper foil tape, for example, may be adopted as the metal foils 13A and 13B. The metal foils 13A and 13B extend from the electricity generating region 11 to the protruding part 14.

Generation voltage of the electricity generating part 12 is applied to the metal foils 13A and 13B. The metal foil 13A is, for example, electrically connected to positive electrode-side leader wiring (not illustrated) that leads from the electricity generating part 12. In this case, positive electrode-side voltage of the electricity generating part 12 is applied to the metal foil 13A. The metal foil 13B is, for example, electrically connected to negative electrode-side leader wiring (not illustrated) that leads from the electricity generating part 12. In this case, negative electrode-side voltage of the electricity generating part 12 is applied to the metal foil 13B.

The protruding part 14 protrudes from the electricity generating region 11. The protruding part 14 and the electricity generating region 11 may be formed as a unified body. The thickness of the protruding part 14 may be the same as the thickness of the electricity generating region 11 as illustrated in FIG. 2.

The protruding part 14 includes a pair of holes 15A and 15B. In a case in which the energy harvester 1 includes a first housing 30 and a second housing 40, for example, the protruding part 14 may further include a pair of first through holes 16A and 16B. Note that the number of holes included in the protruding part 14 in FIG. 4 is two (i.e., holes 15A and 15B). However, the number of holes included in the protruding part 14 is not limited to this number. The number of holes included in the protruding part 14 may alternatively be three or more. In FIG. 4, the holes 15A and 15B are formed at a surface at a negative Z-axis direction side of the protruding part 14 (for example, a front surface). However, the holes 15A and 15B may be formed at a surface at a positive Z-axis direction side of the protruding part 14 (for example, a rear surface). Moreover, the number of first through holes included in the protruding part 14 in FIG. 4 is two (i.e., first through holes 16A and 16B). However, the number of first through holes included in the protruding part 14 is not limited to this number. The number of first through holes included in the protruding part 14 may alternatively be three or more.

The hole 15A is located above the metal foil 13A. Likewise, the hole 15B is located above the metal foil 13B. The holes 15A and 15B may have a circular shape, for example. However, the holes 15A and 15B are not limited to having a circular shape. For example, the holes 15A and 15B may alternatively have a polygonal shape.

The pair of metal foils 13A and 13B are partially exposed via the pair of holes 15A and 15B, respectively. Part of the metal foil 13A is exposed via the hole 15A, for example. The metal foil 13A exposed via the hole 15A is in electrical contact with a spring 21A of the connector 20A in the assembled state as illustrated in FIG. 3. Part of the metal foil 13B is exposed via the hole 15B, for example. The metal foil 13B exposed via the hole 15B is in electrical contact with a spring 21B of the connector 20B in the assembled state.

The first through holes 16A and 16B pass through the protruding part 14 in a Z-axis direction. The first through holes 16A and 16B may have a circular shape, for example. However, the first through holes 16A and 16B are not limited to having a circular shape. The first through holes 16A and 16B may each have a shape that is in accordance with the external shape of projecting parts 31A and 31B of the first housing 30 illustrated in FIG. 2. For example, the first through holes 16A and 16B may have a polygonal shape in a case in which the external shape of the projecting parts 31A and 31B of the first housing 30 is a polygonal shape.

The projecting part 31A of the first housing 30 illustrated in FIG. 2 is inserted through the first through hole 16A in the assembled state. The projecting part 31B of the first housing 30 illustrated in FIG. 2 is inserted through the first through hole 16B in the assembled state.

[Configuration of Connectors]

Figure 5:
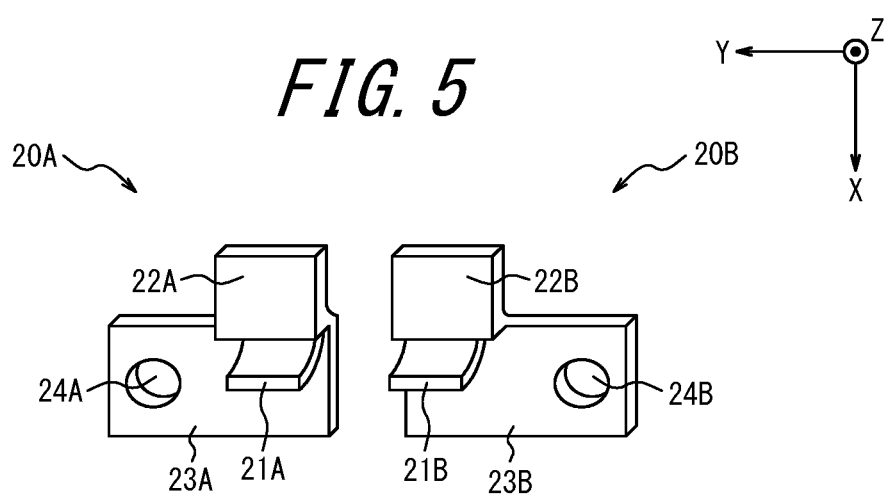
FIG. 5 illustrates schematic configuration of connectors according to the first embodiment of the present disclosure.

FIG. 5 illustrates schematic configuration of the connectors 20A and 20B according to the first embodiment of the present disclosure. The connectors 20A and 20B are electrically conductive. The connector 20A includes a spring 21A, a terminal part 22A, and a flat plate part 23A. The connector 20B includes a spring 21B, a terminal part 22B, and a flat plate part 23B. Note that the spring 21A, the terminal part 22A, and the flat plate part 23A may be formed as a unified body by a conductive material. The conductive material may, for example, be a metal material selected from the group consisting of copper, aluminum, nickel, and iron, or an alloy material including any of these metal materials. Forming the spring 21A, the terminal part 22A, and the flat plate part 23A as a unified body in this manner can simplify the production process of the connector 20A. The same applies for the connector 20B.

The springs 21A and 21B may, for example, each be a leaf spring. However, the springs 21A and 21B are not limited to being leaf springs. The springs 21A and 21B should display elasticity and may alternatively each be a coil spring, for example.

In the assembled state, the spring 21A is electrically connected to the metal foil 13A exposed via the hole 15A as illustrated in FIG. 3. Through this configuration, positive electrode-side voltage of the electricity generating part 12 illustrated in FIG. 4 is applied to the spring 21A via the metal foil 13A when the electricity generating part 12 generates electricity. In the same manner, the spring 21B is electrically connected to the metal foil 13B exposed via the hole 15B in the assembled state. Through this configuration, negative electrode-side voltage of the electricity generating part 12 illustrated in FIG. 4 is applied to the spring 21B via the metal foil 13B when the electricity generating part 12 generates electricity.

The spring 21A is pressed against by the metal foil 13A in the assembled state as illustrated in FIG. 3. Likewise, the spring 21B is pressed against by the metal foil 13B in the assembled state. Through this configuration, contact strength between the spring 21A and the metal foil 13A and contact strength between the spring 21B and the metal foil 13B can be increased. This can increase the reliability of conductive connection between the energy harvesting section 10 and the connectors 20A and 20B.

Note that the spring 21A can be electrically connected to the metal foil 13A by matching the position of the spring 21A and the position of the hole 15A during an assembly process. Likewise, the spring 21B can be electrically connected to the metal foil 13B by matching the position of the spring 21B and the position of the hole 15B during the assembly process. This configuration can simplify the assembly process.

The terminal part 22A is electrically connected to the spring 21A. The terminal part 22B is electrically connected to the spring 21B. Moreover, the terminal parts 22A and 22B are connectable to an external device. The terminal part 22A can, for example, be electrically connected to the positive electrode terminal 101 of the female connector 100 illustrated in FIG. 1. The terminal part 22B can, for example, be electrically connected to the negative electrode terminal 102 of the female connector 100 illustrated in FIG. 1. By connecting the terminal parts 22A and 22B to an external device, electrical power generated by the electricity generating part 12 illustrated in FIG. 4 is supplied to the external device via the springs 21A and 21B.

A protrusion 33 of the first housing 30 illustrated in FIG. 2 is arranged between the terminal part 22A and the terminal part 22B as an electrical insulator. Short-circuiting between the terminal part 22A and the terminal part 22B can be prevented as a result of an electrical insulator being arranged between the terminal part 22A and the terminal part 22B. Note that in a case in which the energy harvester 1 does not include the first housing 30 illustrated in FIG. 2, the energy harvester 1 may include an electrical insulator between the terminal part 22A and the terminal part 22B. This example of configuration is described further below in a fourth modified example.

The thickness d1 of the terminal part 22A may be larger than the thickness d2 of the flat plate part 23A as illustrated in FIG. 3. Likewise, the thickness of the terminal part 22B may be larger than the thickness of the flat plate part 23B. The strength of the terminal parts 22A and 22B can be increased be increasing the thickness of the terminal parts 22A and 22B. Increased strength of the terminal parts 22A and 22B can increase the reliability of connection between the energy harvester 1 and an external device. In the present embodiment, the thickness of the terminal parts 22A and 22B is increased, whereas the thickness of the flat plate parts 23A and 23B is not particularly increased. This configuration can suppress an increase in the thickness of the energy harvester 1 in the assembled state, and thus can increase the reliability of connection between the energy harvester 1 and an external device without loss of the portability of the energy harvester 1 as a whole.

Note that the thickness of the terminal parts 22A and 22B may be set based on the desired strength. For example, the thickness d1 of the terminal part 22A may be 0.7 mm or more.

Figure 6:
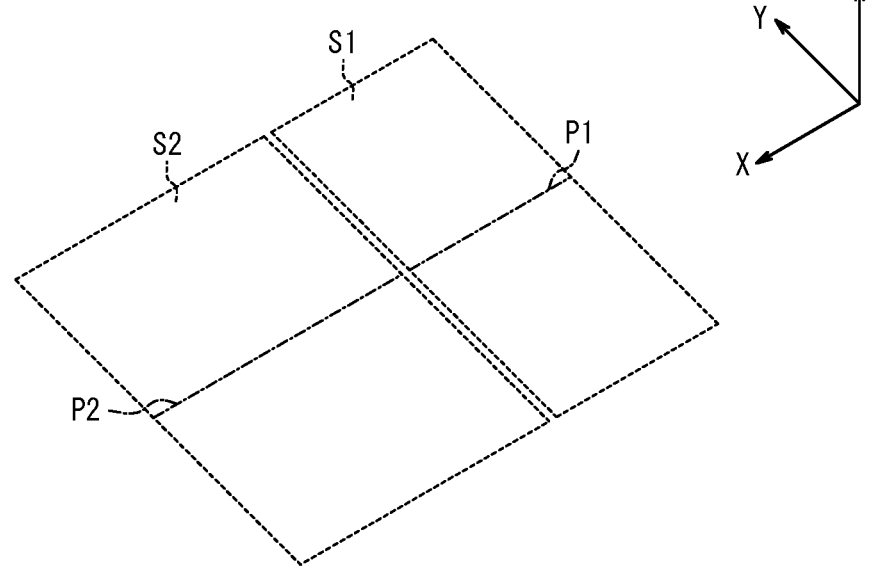
FIG. 6 is a diagram for facilitating description of a positional relationship between a terminal part and an energy harvesting section.

The following describes one example of the positional relationship between the terminal part 22A and the energy harvesting section 10. FIG. 6 is a diagram for facilitating description of the positional relationship between the terminal part 22A and the energy harvesting section 10.

A plane S1 illustrated in FIG. 6 is a plane that passes along a center line P1 illustrated in FIG. 3 and is perpendicular to a thickness direction of the terminal part 22A illustrated in FIG. 3. The center line P1 is a center line of the thickness direction of the terminal part 22A illustrated in FIG. 3. A plane S2 illustrated in FIG. 6 is a plane that passes along a center line P2 illustrated in FIG. 3 and is perpendicular to a thickness direction of the energy harvesting section 10 illustrated in FIG. 3. The center line P2 is a center line of the thickness direction of the energy harvesting section 10 illustrated in FIG. 3. In the positional relationship of the terminal part 22A and the energy harvesting section 10, the plane S1 and the plane S2 may roughly coincide as illustrated in FIG. 6. A similar configuration may be adopted for the positional relationship of the terminal part 22B and the energy harvesting section 10. This configuration can prevent deformation and damage of the energy harvester 1 by external force when external force acts on the energy harvester 1.

Depending on the shapes of the terminal parts 22A and 22B and the energy harvesting section 10, it may not be possible to simply identify the center line P1 or the center line P2. In such a case, a surface that passes through a center of gravity of the flat plate-shaped energy harvesting section 10 and that is roughly parallel to the energy harvesting section 10 and a surface that passes through a center of gravity of the terminal part 22A and that is perpendicular to the thickness direction of the terminal part 22A may be roughly the same. A similar configuration may be adopted for the positional relationship of the terminal part 22B and the energy harvesting section 10. In a case in which the center line P1 or the center line P2 cannot be simply identified, this configuration can prevent deformation and damage of the energy harvester 1 by external force when external force acts on the energy harvester 1.

Note that with regards to the positional relationship of the terminal part 22A and the energy harvesting section 10, in a cross-section of the energy harvesting section 10 that is parallel to an XZ-plane illustrated in FIG. 3, the center line P1 and the center line P2 may roughly coincide and may be roughly parallel to the insertion/extraction direction. In the present embodiment, a cross-section of the energy harvesting section 10 that is parallel to an XZ-Plane is a cross-section that is roughly parallel to the insertion/extraction direction and is perpendicular to the flat plate-shaped energy harvesting section 10. A similar configuration may be adopted for the positional relationship of the terminal part 22B and the energy harvesting section 10. This configuration can prevent force from acting on the energy harvester 1 in a direction other than the insertion/extraction direction when the energy harvester 1 is inserted into or extracted from an external connector. Consequently, deformation and damage of the energy harvester 1 can be prevented.

Depending on the shapes of the terminal parts 22A and 22B and the energy harvesting section 10, it may not be possible to simply identify the center line P1 or the center line P2. In such a case, a surface that passes through a center of gravity of the flat plate-shaped energy harvesting section 10 and that is roughly parallel to the energy harvesting section 10 and a surface that passes through a center of gravity of the terminal part 22A and that is perpendicular to the thickness direction of the terminal part 22A may be roughly the same and may be roughly parallel to the insertion/extraction direction. A similar configuration may be adopted for the positional relationship of the terminal part 22B and the energy harvesting section 10. In a case in which the center line P1 or the center line P2 cannot be simply identified, this configuration can prevent force from acting on the energy harvester 1 in a direction other than the insertion/extraction direction when the energy harvester 1 is inserted into or extracted from an external device. Consequently, deformation and damage of the energy harvester 1 can be prevented.

The flat plate parts 23A and 23B illustrated in FIG. 5 overlap with the energy harvesting section 10 in the assembled state. For example, the flat plate parts 23A and 23B may overlap with the protruding part 14 illustrated in FIG. 4. In such a case, the flat plate part 23A overlaps with a region of the protruding part 14 where the hole 15A is present such that the position of the spring 21A coincides with the position of the hole 15A illustrated in FIG. 4. Likewise, the flat plate part 23B overlaps with a region of the protruding part 14 where the hole 15B is present such that the position of the spring 21B coincides with the position of the hole 15B illustrated in FIG. 4.

The flat plate part 23A may include a second through hole 24A as illustrated in FIG. 5. Likewise, the flat plate part 23B may include a second through hole 24B as illustrated in FIG. 5. Note that the number of second through holes included in the flat plate parts 23A and 23B is not limited to one each (i.e., second through holes 24A and 24B). The number of second through holes included in each of the flat plate parts 23A and 23B may alternatively be two or more.

The second through hole 24A passes through the flat plate part 23A. Likewise, the second through hole 24B passes through the flat plate part 23B. The second through holes 24A and 24B may have a circular shape, for example. However, the second through holes 24A and 24B are not limited to a circular shape. The second through holes 24A and 24B may each have a shape in accordance with the external shape of the projecting parts 31A and 31B of the first housing 30 illustrated in FIG. 2. For example, the second through holes 24A and 24B may have a polygonal shape in a case in which the external shape of the projecting parts 31A and 31B of the first housing 30 is a polygonal shape.

The second through hole 24A is disposed at a location where the first through hole 16A is positioned when the flat plate part 23A is overlapped with the region of the protruding part 14 where the hole 15A is present. The projecting part 31A of the first housing 30 illustrated in FIG. 2 is inserted through the second through hole 24A in the assembled state. The second through hole 24B is disposed at a location where the first through hole 16B is positioned when the flat plate part 23B is overlapped with the region of the protruding part 14 where the hole 15B is present. The projecting part 31B of the first housing 30 illustrated in FIG. 2 is inserted through the second through hole 24B in the assembled state. Through this configuration, the flat plate part 23A and the flat plate part 23B are fixed to the protruding part 14 when the energy harvesting section 10 and the connectors 20A and 20B are unified.

Note that the flat plate part 23A may not include the second through hole 24A in a case in which the protruding part 14 does not include the first through hole 16A, for example. Likewise, the flat plate part 23B may not include the second through hole 24B in a case in which the protruding part 14 does not include the first through hole 16B, for example. In such a case, the flat plate parts 23A and 23B may each be fixed to the protruding part 14 by an adhering member when the energy harvesting section 10 and the connectors 20A and 20B are unified. The adhering member may be an adhesive, adhesive tape, or the like.

[Configuration of First Housing]

Figure 7:
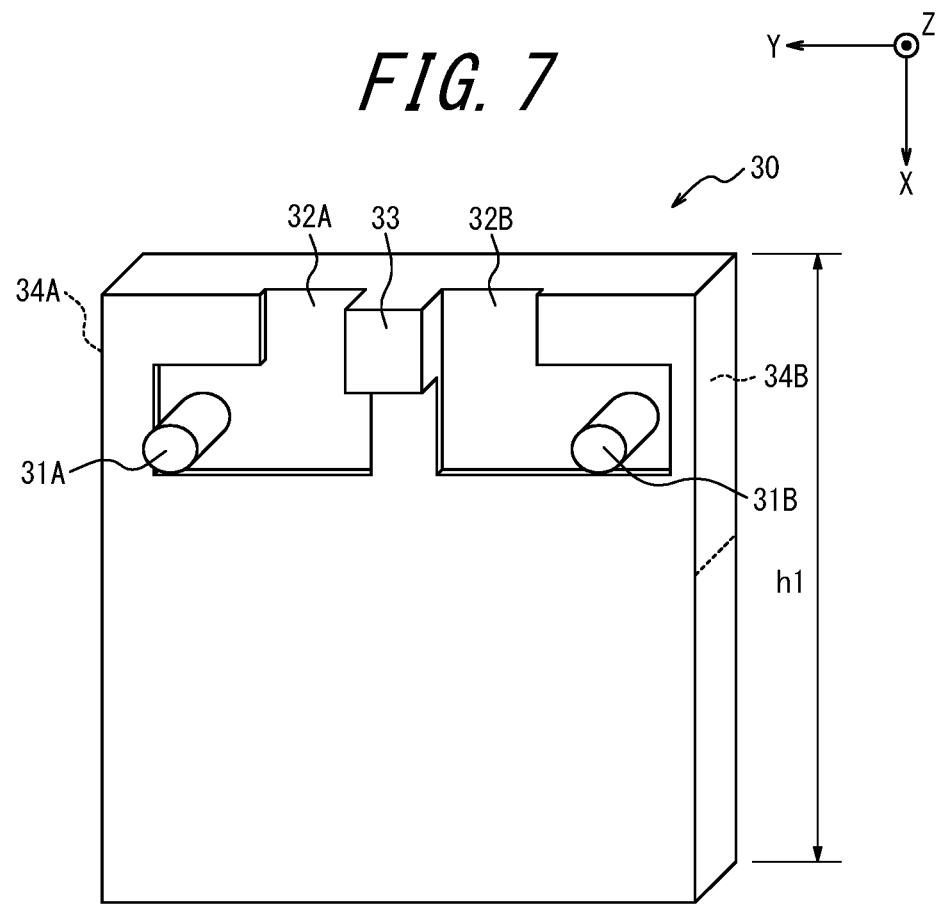
FIG. 7 illustrates schematic configuration of a first housing according to the first embodiment of the present disclosure.

FIG. 7 illustrates schematic configuration of the first housing 30 according to the first embodiment of the present disclosure. The first housing 30 is electrically insulating. The first housing 30 may be formed from a resin material or the like. The first housing 30 and the subsequently described second housing 40 sandwich the protruding part 14 and the connectors 20A and 20B illustrated in FIG. 2.

The first housing 30 includes a pair of projecting parts 31A and 31B. In addition, the first housing 30 may include depressed parts 32A and 32B and a protrusion 33.

The projecting part 31A is inserted through the first through hole 16A of the protruding part 14 and the second through hole 24A of the connector 20A in the assembled state as illustrated in FIG. 2. Likewise, the projecting part 31B is inserted through the first through hole 16B of the protruding part 14 and the second through hole 24B of the connector 20B in the assembled state. Moreover, the projecting part 31A is fitted into a fitting part 41A of the second housing 40 illustrated in FIG. 8 in the assembled state. Likewise, the projecting part 31B is fitted into a fitting part 41B of the second housing 40 illustrated in FIG. 8 in the assembled state. Through the projecting parts 31A and 31B described above, the connectors 20A and 20B and the energy harvesting section 10 illustrated in FIG. 2 can be collectively unified, and the flat plate parts 23A and 23B can each be fixed to the protruding part 14.

In the assembled state, the depressed part 32A has the terminal part 22A and the flat plate part 23A of the connector 20A fitted therein as illustrated in FIG. 2. The depressed part 32A is formed such as to enable fitting of the terminal part 22A and the flat plate part 23A of the connector 20A. Likewise, the depressed part 32B has the terminal part 22B and the flat plate part 23B of the connector 20B fitted therein in the assembled state. The depressed part 32B is formed such as to enable fitting of the terminal part 22B and the flat plate part 23B of the connector 20B. This configuration can reduce the thickness of the first housing 30.

The protrusion 33 is arranged between the terminal part 22A of the connector 20A and the terminal part 22B of the connector 20B in the assembled state as illustrated in FIG. 2.

Figure 8:
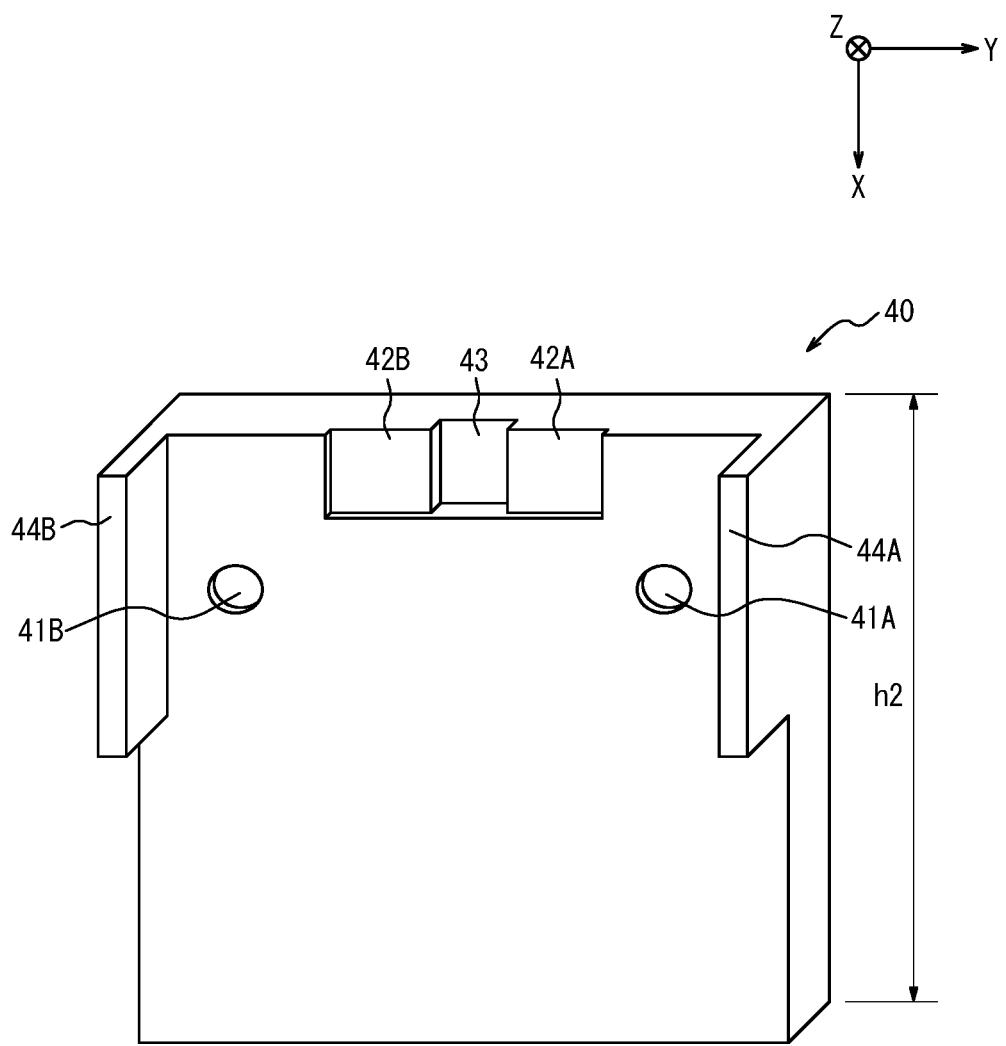
FIG. 8 illustrates schematic configuration of a second housing according to the first embodiment of the present disclosure.

A side wall part 44A of the second housing 40 illustrated in FIG. 8 abuts against a region 34A of a side surface of the first housing 30 in the assembled state. Likewise, a side wall part 44B of the second housing 40 abuts against a region 34B of a side surface of the first housing 30 in the assembled state. Note that the region 34A may include a depressed shape that matches the shape of the side wall part 44A of the second housing 40. Likewise, the region 34B may include a depressed shape that matches the shape of the side wall part 44B of the second housing 40.

[Configuration of Second Housing]

FIG. 8 illustrates schematic configuration of the second housing 40 according to the first embodiment of the present disclosure. The second housing 40 is electrically insulating in the same manner as the first housing 30. The second housing 40 may be formed from a resin material or the like.

The second housing 40 includes a pair of fitting parts 41A and 41B. In addition, the second housing 40 may include depressed parts 42A and 42B, a depressed part 43, and side wall parts 44A and 44B.

The fitting part 41A has the projecting part 31A of the first housing 30 illustrated in FIG. 2 fitted therein in the assembled state. Likewise, the fitting part 41B has the projecting part 31B of the first housing 30 illustrated in FIG. 2 fitted therein in the assembled state.

The depressed part 42A has the terminal part 22A of the connector 20A illustrated in FIG. 2 fitted therein in the assembled state. The depressed part 42A is formed such as to enable fitting of the terminal part 22A of the connector 20A. Likewise, the depressed part 42B has the terminal part 22B of the connector 20B illustrated in FIG. 2 fitted therein in the assembled state. The depressed part 42B is formed such as to enable fitting of the terminal part 22B of the connector 20B. This configuration can reduce the thickness of the second housing 40.

The depressed part 43 has the protrusion 33 of the first housing 30 illustrated in FIG. 2 fitted therein in the assembled state. The depressed part 43 is formed such as to enable fitting of the protrusion 33 of the first housing 30. This configuration can reduce the thickness of the second housing 40.

The side wall part 44A abuts against the region 34A of a side surface of the first housing 30 illustrated in FIG. 7 in the assembled state. Likewise, the side wall part 44B abuts against the region 34B of a side surface of the first housing 30 illustrated in FIG. 7 in the assembled state.

The height h1 of the first housing 30 illustrated in FIG. 7 and the height h2 of the second housing 40 illustrated in FIG. 8 may be the same. Moreover, the height h1 of the first housing 30 and the height h2 of the second housing 40 may be adjusted as appropriate such that surfaces of the first housing 30 and the second housing 40 and surfaces of the terminal parts 22A and 22B roughly coincide as illustrated in FIG. 1. Through this configuration, it is possible to prevent tips of the terminal parts 22A and 22B from protruding from the surfaces of the first housing 30 and the second housing 40 as illustrated in FIG. 1. This can prevent damage caused by the tips of the terminal parts 22A and 22B coming into contact with other objects.

Note that depending on the application of the energy harvester 1, it may not be necessary to adjust the height of the surfaces of the first housing 30 and the second housing 40 and the height of the surfaces of the terminal parts 22A and 22B so as to roughly coincide. This example of configuration is described further below in a second modified example.

First Modified Example

Either or both of the first housing 30 and the second housing 40 may have a shape or member that is dependent on an external device. The following describes this example of configuration as a first modified example with reference to FIG. 9A, etc.

FIGS. 9A, 9B, 9C, and 9D illustrate the first modified example of the energy harvester 1 illustrated in FIG. 1. FIGS. 9A to 9D each correspond to an enlarged view of the dotted line section X illustrated in FIG. 1.

Figure 9A:
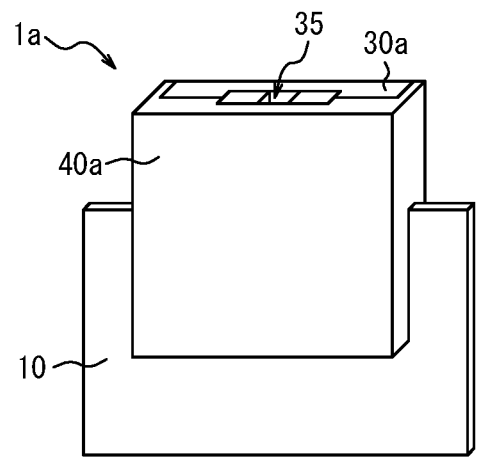
FIG. 9A illustrates a first modified example of the energy harvester illustrated in FIG. 1.

An energy harvester 1a illustrated in FIG. 9A includes a first housing 30a according to a modified example and a second housing 40a according to a modified example. The first housing 30a differs from the first housing 30 illustrated in FIG. 7 in terms that it does not include the protrusion 33. Moreover, the second housing 40a illustrated in FIG. 9A differs from the second housing 40 illustrated in FIG. 8 in terms that it does not include the depressed part 43.

A cavity 35 is formed when the first housing 30a and the second housing 40a described above are in the assembled state. In other words, the first housing 30a and the second housing 40a have the cavity 35 as a shape that is dependent on an external device. This configuration is described in more detail with reference to FIG. 10.

FIG. 10 illustrates an example of the energy harvester 1a illustrated in FIG. 9A being inserted into a female connector 100a serving as an external device. The female connector 100a includes an electrically insulating part 103 in addition to a positive electrode terminal 101 and a negative electrode terminal 102. When the energy harvester 1a is inserted into the female connector 100a, the electrically insulating part 103 is inserted into the cavity 35 and thus becomes positioned between the terminal part 22A and the terminal part 22B. This configuration can prevent short-circuiting between the terminal part 22A and the terminal part 22B.

Figure 9B:
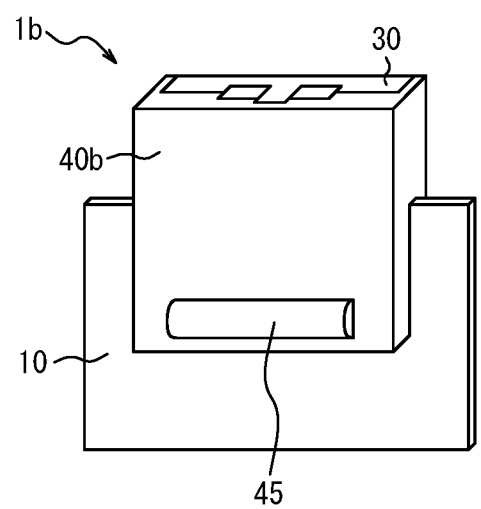
FIG. 9B illustrates the first modified example of the energy harvester illustrated in FIG. 1.

An energy harvester 1b illustrated in FIG. 9B includes a second housing 40b according to a modified example. The second housing 40b differs from the second housing 40 illustrated in FIG. 8 in terms that it has a protruding part 45 at the surface thereof. The protruding part 45 fits with a depressed part formed in an external device. In other words, the second housing 40b has the protruding part 45 that fits with a depressed part formed in an external device as a shape that is dependent on an external device. Through this configuration, the energy harvester 1b does not easily detach from an external device when the energy harvester 1b has been inserted into the external device and is being used.

Note that a protruding part similar to the protruding part 45 may be formed in the first housing 30. Moreover, in a case in which a protruding part is formed in an external device, a depressed part that fits with the protruding part of the external device may be formed in the second housing 40b instead of the protruding part 45.

Figure 9C:
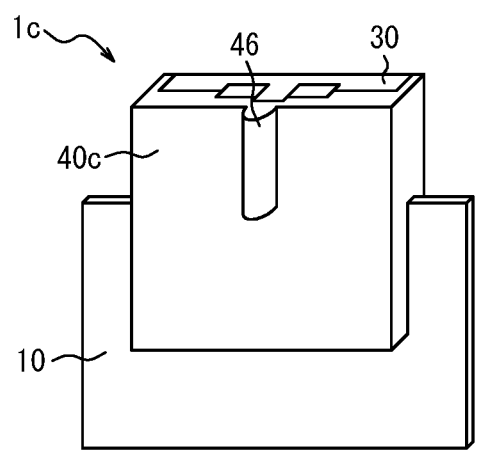
FIG. 9C illustrates the first modified example of the energy harvester illustrated in FIG. 1.

An energy harvester 1c illustrated in FIG. 9C includes a second housing 40c according to a modified example. The second housing 40c differs from the second housing 40 illustrated in FIG. 8 in terms that it has a ridge part 46 formed at the surface thereof. The ridge part 46 fits with a groove part formed in an external device. In other words, the second housing 40c has the ridge part 46 that fits with a groove part formed in an external device as a shape that is dependent on an external device. Through this configuration, the energy harvester 1c does not easily detach from an external device when the energy harvester 1c has been inserted into the external device and is being used.

Moreover, in FIG. 9C, in a case in which the groove part formed in the external device is formed along the insertion/extraction direction, the ridge part 46 may also be formed along the insertion/extraction direction. Through this configuration, the ridge part 46 and the groove part of the external device can also serve as an insertion/extraction guide when the energy harvester 1c is inserted into or extracted from the external device. This facilitates insertion of the energy harvester 1c into the external device and extraction of the energy harvester 1c from the external device. Furthermore, the terminal parts 22A and 22B are led to positions that enable more reliable contact with terminal parts of an external device inside the first housing 30 and the second housing 40c. This provides more reliable electrical continuity in the energy harvester 1c.

Note that a ridge part similar to the ridge part 46 may be formed on the first housing 30. Moreover, in a case in which a ridge part is formed on an external device, a groove part that fits with the ridge part of the external device may be formed in the second housing 40c instead of the ridge part 46.

Figure 9D:
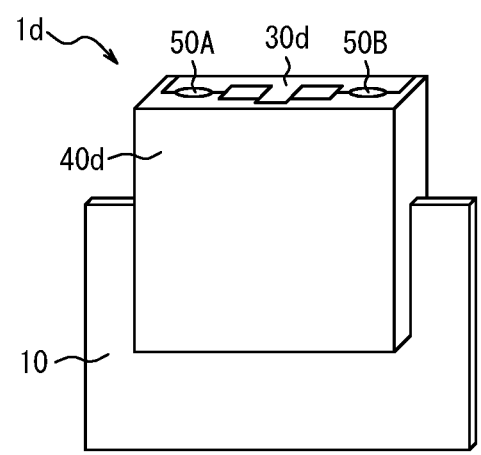
FIG. 9D illustrates the first modified example of the energy harvester illustrated in FIG. 1.

An energy harvester 1d illustrated in FIG. 9D includes a first housing 30d according to a modified example and a second housing 40d according to a modified example. The first housing 30d and the second housing 40d have magnets 50A and 50B disposed in inner parts thereof. The magnets 50A and 50B are of opposite polarity to the polarity of a magnet included by an external device. In other words, the first housing 30d and the second housing 40d have the magnets 50A and 50B having opposite polarity to the polarity of a magnet included by an external device as members dependent on an external device.

As a result of the configuration illustrated in FIG. 9D, the magnets 50A and 50B are attracted toward a magnet of an external device when the energy harvester 1d is brought into proximity with the external device by a user in order to insert the energy harvester 1d into the external device. This can improve the feeling of insertion and extraction for a user when the user inserts the energy harvester 1d into an external device. Moreover, through this configuration, the energy harvester 1d does not easily detach from an external device when the energy harvester 1d has been inserted into the external device and is being used.

Second Modified Example

Depending on the application of the energy harvester 1, the form in which the terminal part 22A and the terminal part 22B are exposed from the first housing 30 and the second housing 40 may be changed. This example of configuration is described as a second modified example with reference to FIG. 11A, etc.

Figure 11A:
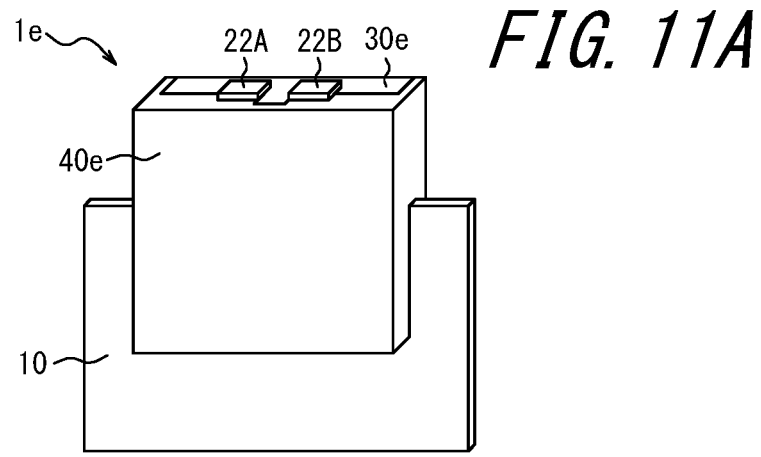
FIG. 11A illustrates a second modified example of the energy harvester illustrated in FIG. 1.
Figure 11B:
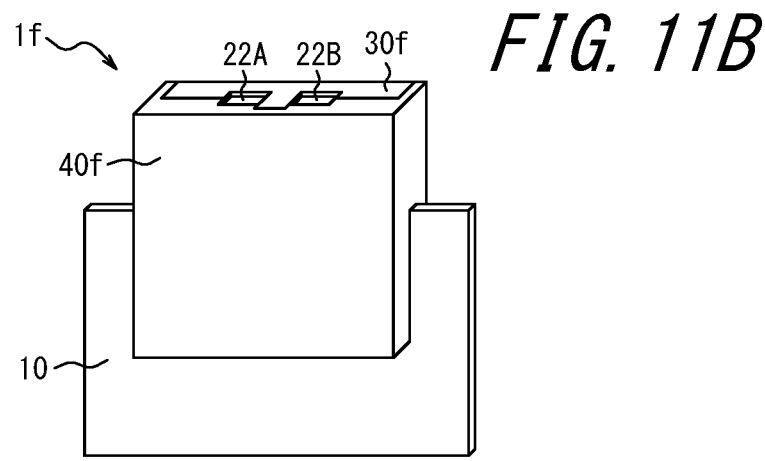
FIG. 11B illustrates the second modified example of the energy harvester illustrated in FIG. 1.
Figure 11C:
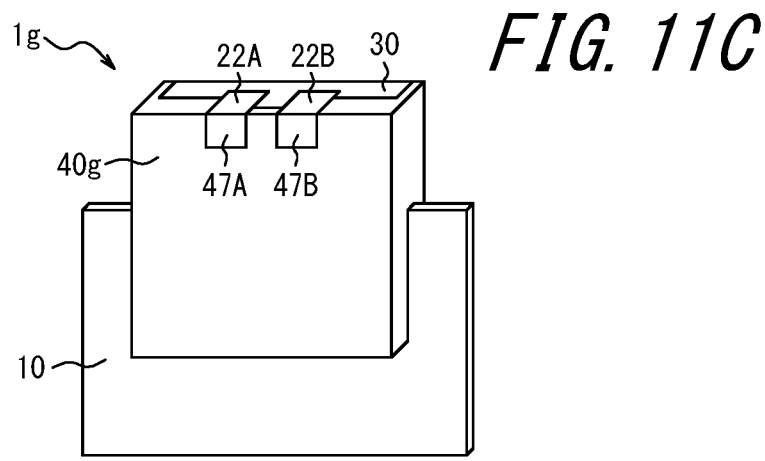
FIG. 11C illustrates the second modified example of the energy harvester illustrated in FIG. 1.

FIGS. 11A, 11B, and 11C illustrate the second modified example of the energy harvester 1 illustrated in FIG. 1. FIGS. 11A to 11C each correspond to an enlarged view of the dotted line section X illustrated in FIG. 1.

An energy harvester 1e illustrated in FIG. 11A includes a first housing 30e according to a modified example and a second housing 40e according to a modified example. The height of the first housing 30e is lower than the height of the first housing 30 illustrated in FIG. 7. Likewise, the height of the second housing 40e is lower than the height of the second housing 40 illustrated in FIG. 8. Through this configuration, the terminal part 22A and the terminal part 22B protrude from the surfaces of the first housing 30e and the second housing 40e. This facilitates contact between the terminal part 22A and a positive electrode terminal of an external device and also contact between the terminal part 22B and a negative electrode terminal of an external device.

Note that instead of reducing the height of the first housing 30e and the second housing 40e, the length of the terminal part 22A and the terminal part 22B may be increased.

An energy harvester 1f illustrated in FIG. 11B includes a first housing 30f according to a modified example and a second housing 40f according to a modified example. The height of the first housing 30f is higher than the height of the first housing 30 illustrated in FIG. 7. Likewise, the height of the second housing 40f is higher than the height of the second housing 40 illustrated in FIG. 8. Through this configuration, the terminal part 22A and the terminal part 22B are depressed inward from the surfaces of the first housing 30f and the second housing 40f. This makes it more difficult for moisture and the like to become attached to the terminal part 22A and the terminal part 22B and can prevent corrosion of the terminal parts 22A and 22B.

Note that instead of increasing the height of the first housing 30f and the second housing 40f, the length of the terminal part 22A and the terminal part 22B may be increased.

An energy harvester 1g illustrated in FIG. 11C includes a second housing 40g according to a modified example. The second housing 40g differs from the second housing 40 illustrated in FIG. 8 in terms that it includes an opening 47A that exposes the terminal part 22A and an opening 47B that exposes the terminal part 22B. Through this configuration, the exposed area of the terminal part 22A can be increased, and thus the contact area between the terminal part 22A and a positive electrode terminal of an external device can be increased. Likewise, the exposed area of the terminal part 22B can be increased, and thus the contact area between the terminal part 22B and a negative electrode terminal of an external device can be increased. This can increase the reliability of conductive connection between the energy harvester 1g and an external device.

Third Modified Example

The following describes a modified example of the energy harvesting section 10 as a third modified example.

FIG. 12 illustrates the third modified example of the energy harvester 1 illustrated in FIG. 1. FIG. 12 illustrates a section corresponding to the dotted line section X illustrated in FIG. 1. Note that the connectors 20A and 20B, the first housing 30, and the second housing 40 are omitted from FIG. 12.

An energy harvester 1h according to the third modified example includes an energy harvesting section 10a according to a modified example. The energy harvesting section 10a includes a notch 17A and a notch 17B at a boundary between a protruding part 14 and an electricity generating region 11. Protruding members that are additionally formed on the first housing 30, for example, can be inserted into the notches 17A and 17B. The protruding members may have shapes that match the shapes of the notch 17A and the notch 17B. Through this configuration, the reliability of joining between the energy harvesting section 10a and an exterior part such as the first housing 30 can be increased.

Fourth Modified Example

The following describes a modified example of the pair of connectors 20A and 20B as a fourth modified example.

FIG. 13 illustrates the fourth modified example of the energy harvester 1 illustrated in FIG. 1. Note that the energy harvesting section 10, the first housing 30, and the second housing 40 are omitted from FIG. 13.

An energy harvester 1i according to the fourth modified example is a suitable configuration in a case in which the protrusion 33 is not formed on the first housing 30 and in a case in which the energy harvester 1 does not include the first housing 30.

The energy harvester 1i according to the fourth modified example includes an electrical insulator 25. The electrical insulator 25 is arranged between the connector 20A and the connector 20B. Through this configuration, short-circuiting between the terminal part 22A and the terminal part 22B can be prevented even in a case in which the protrusion 33 is not formed on the first housing 30 or a case in which the energy harvester 1i does not include the first housing 30.

Note that the connector 20A, the connector 20B, and the electrical insulator 25 may be formed as a unified body. This can simplify an assembly process of the energy harvester 1i. For example, connectors 20A and 20B made from a metal material and an electrical insulator 25 made from a resin material or the like may be joined as a unified body to form a structure. Alternatively, an electrical insulator may be formed using a resin material or the like such as to have a shape that is a unification of the connectors 20A and 20B and the electrical insulator 25 illustrated in FIG. 13, and then a conductive coating may be provided on the surface of the formed electrical insulator, with the exception of a section corresponding to the surface of the electrical insulator 25, to form a structure.

Second Embodiment

Figure 14:
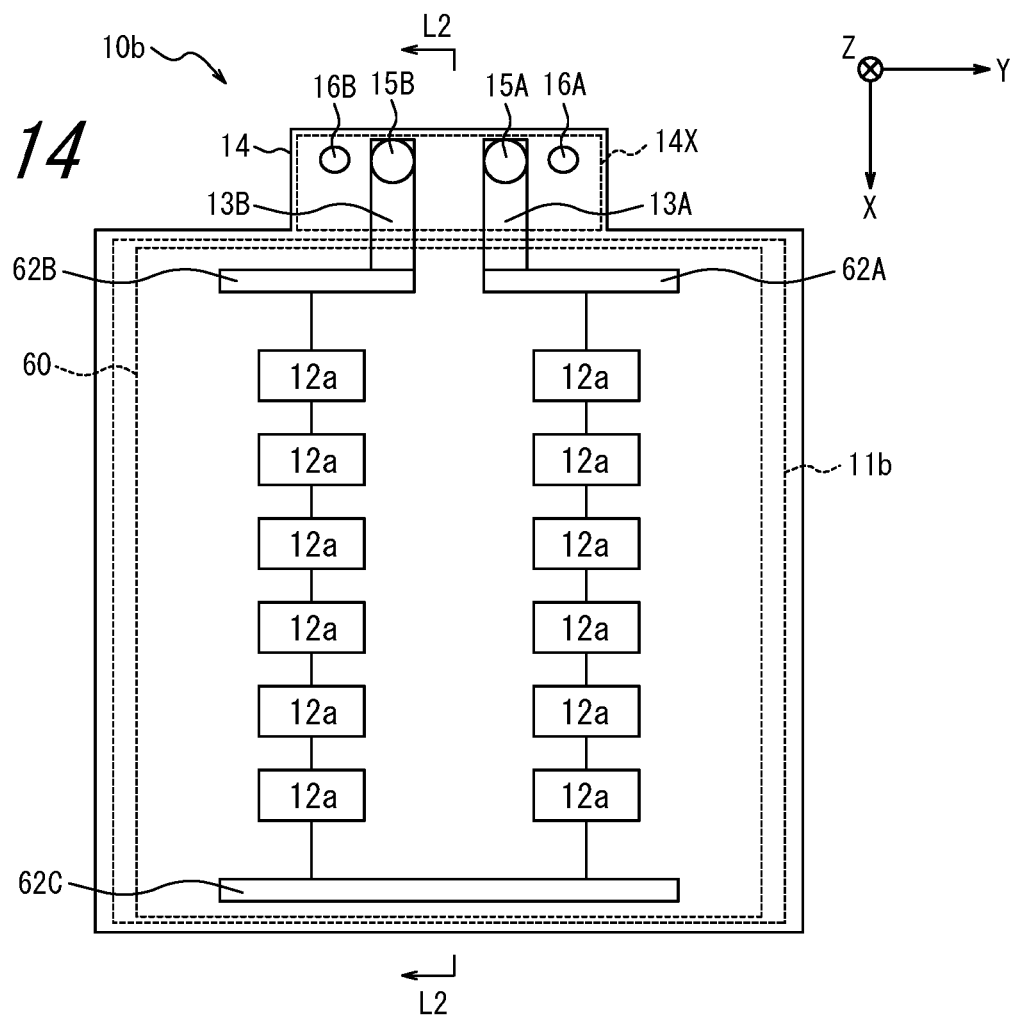
FIG. 14 illustrates schematic configuration of an energy harvesting section according to a second embodiment of the present disclosure.
Figure 15:
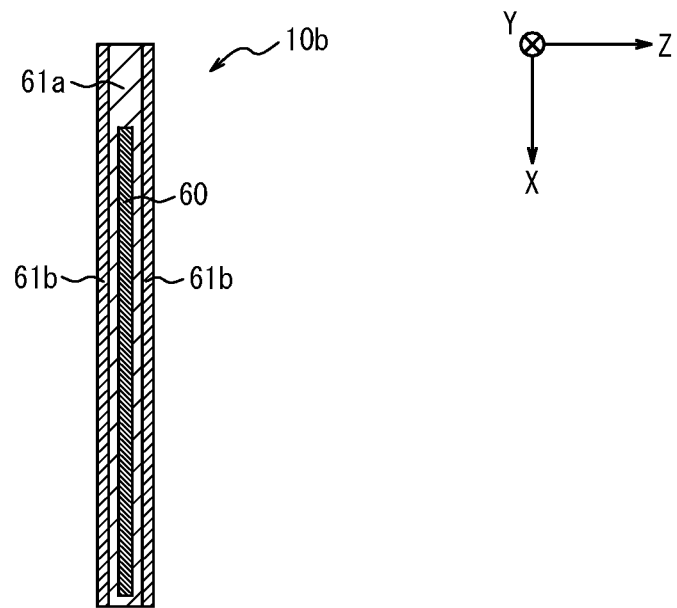
FIG. 15 is a cross-sectional view at an L2-L2 line of the energy harvesting section illustrated in FIG. 14.

The following describes a second embodiment of the present disclosure with reference to FIGS. 14 and 15. In the second embodiment, an example in which the energy harvesting section 10 described in the first embodiment includes dye-sensitized solar cells is described.

FIG. 14 illustrates schematic configuration of an energy harvesting section 10b according to the second embodiment of the present disclosure. FIG. 15 is a cross-sectional view at an L2-L2 line of the energy harvesting section 10b illustrated in FIG. 14.

The energy harvesting section 10b includes an electricity generating region 11b, metal foils 13A and 13B, and a protruding part 14 as illustrated in FIG. 14. The energy harvesting section 10b also includes a pair of electrode base plates 60, a filling member 61a, and an exterior member 61b as illustrated in FIG. 15. The electricity generating region 11b includes 12 solar cells 12a as an electricity generating part and collector electrodes 62A, 62B, and 62C. Note that the 12 solar cells 12a each have a structure in which a photoelectrode and a counter electrode are in opposition to one another with an electrolyte layer sandwiched in-between and in which the perimeter is sealed. The photoelectrodes are each formed on one of the electrode base plates 60 that has been made electrically insulating by appropriate laser processing or the like of sections where electrical insulation is required at the cell perimeters and/or an arrangement region or the like of the collector electrode 62A, etc. The counter electrodes are formed in the same manner on one of the electrode base plates 60. The collector electrodes 62A, 62B, and 62C are each formed on one or the other of the electrode base plates 60.

Note that the electricity generating region 11b illustrated in FIG. 14 includes 12 solar cells 12a. However, the number of solar cells included in the electricity generating region 11b is not limited to this number. The number of solar cells included in the electricity generating region 11b may alternatively be 11 or fewer, or may alternatively be 13 or more.

The solar cells 12a convert light energy of incident light, such as sunlight or indoor light, to electrical energy. The solar cells 12a may be dye-sensitized solar cells, for example. The dye-sensitized solar cells generate electricity through absorption of light and production of electrons by a dye that is adsorbed on porous titania.

The solar cells 12a are connected by electrode connectors (not illustrated) between the pair of electrode base plates 60. In one example, the electrode connectors can be formed by collector wiring and conductive fine particles such as disclosed in WO 2013/005770 A1. FIG. 14 illustrates a configuration in which two series connection units each have 6 of the solar cells 12a connected in series. One of the two series connection units is arranged at a side corresponding to the metal foil 13A and is connected to the collector electrode 62A. Moreover, the other of the series connection units is arranged at the metal foil 13B and is connected to the collector electrode 62B. In addition, the series connection unit at the side corresponding to the metal foil 13A and the series connection unit at the side corresponding to the metal foil 13B are connected in series through the collector electrode 62C.

In this manner, the series connection units including the 12 solar cells 12a have a configuration that is turned back at the collector electrode 62C. Through this configuration, the distance between the metal foil 13A and the metal foil 13B can be narrowed, and the Y-axis direction width of the protruding part 14 can be reduced. Moreover, this configuration can reduce the distance between the position of a hole 15A and the collector electrode 62A and can reduce the length of the metal foil 13A. Likewise, this configuration can reduce the distance between the position of a hole 15B and the collector electrode 62B and can reduce the length of the metal foil 13B. Reducing the lengths of the metal foils 13A and 13B can reduce wiring resistance inside the energy harvesting section 10b.

Note that the connection configuration of the solar cells 12a is not limited to the configuration illustrated in FIG. 14. The connection configuration of the solar cells 12a can be altered as appropriate depending on application or necessity.

An end part of the metal foil 13A overlaps with part of the collector electrode 62A. The end part of the metal foil 13A is connected to part of the collector electrode 62A via a connecting member such as a conductive adhesive. An end part of the metal foil 13B overlaps with part of the collector electrode 62B. The end part of the metal foil 13B is connected to part of the collector electrode 62B via a connecting member such as a conductive adhesive.

The filling member 61a fills an inner part of the energy harvesting section 10b. An optical clear adhesive (OCA) film, a high-transparency resin, or the like can be used as the filling member 61a from a viewpoint of ensuring transparency or the like.

A material having a function in accordance with the application, a material in which a member that displays a function is mixed, or a member having a functional film formed at the surface can be used as the exterior member 61b. Specific examples of functions include a barrier function of inhibiting transmission of water vapor or gases, a cutting function of cutting a specific wavelength, such as ultraviolet, an antifouling function of preventing surface dirt, a hard coating function of preventing surface scratching, and a color coating function of changing the color of a panel main body. Moreover, the exterior member 61b may be a single sheet that is provided with a plurality of functions or may have a configuration in which a plurality of sheets of exterior members 61b that are each provided with a function are overlapped.

The collector electrodes 62A to 62C are connected to electrodes of solar cells 12a that are electrically at the ends of the plurality of solar cells 12a. In FIG. 14, one end of the collector electrode 62A is electrically connected to a positive electrode of a solar cell 12a in the series connection unit arranged at the side corresponding to the metal foil 13A. The other end of the collector electrode 62A is electrically connected to the metal foil 13A. Moreover, one end of the collector electrode 62B is connected to a negative electrode of a solar cell 12a in the series connection unit arranged at the side corresponding to the metal foil 13B. One end of the collector electrode 62B is electrically connected to the metal foil 13B. Furthermore, one end of the collector electrode 62C is electrically connected to a negative electrode of a solar cell 12a in the series connection unit arranged at the side corresponding to the metal foil 13A. The other end of the collector electrode 62C is electrically connected to a positive electrode of a solar cell 12a in the series connection unit arranged at the side corresponding to the metal foil 13B.

The electrode base plates 60 of the solar cells 12a to which the collector electrodes 62A to 62C are connected may each be, for example, an electrode base plate including a transparent supporting substrate such as a plastic film or glass and transparent electrodes containing ITO (indium tin oxide) or the like that are formed on the transparent supporting substrate. A transparent electrode containing ITO or the like has a high resistance value. Therefore, in a case in which the electrodes of the solar cells 12a are transparent electrodes such as described above, the collector electrodes 62A to 62C may contain silver. When the collector electrodes 62A to 62C contain silver, the resistance value of the electricity generating part as a whole can be reduced.

Moreover, the collector electrodes 62A to 62C may be formed on one of the electrode base plates 60 in the electricity generating region 11b by screen printing using silver paste. The silver paste may, for example, be a mixture of silver particles and a resin. Through a method such as described above, the collector electrodes 62A to 62C can be made thinner than in a case in which they are formed using metal foils. The formation of thinner collector electrodes 62A to 62C enables further size reduction of the energy harvesting section 10b.

In addition, in a case in which the collector electrodes 62A to 62C are formed from silver paste, the surfaces thereof are rougher than those of typical conductive base plates. Consequently, formation of the collector electrodes 62A to 62C using silver paste can increase close adherence between the collector electrode 62A and the metal foil 13A and close adherence between the collector electrode 62B and the metal foil 13B.

A case is envisaged in which, for example, holes that are in communication with the collector electrodes 62A and 62B are directly formed in the electricity generating region 11b, and in which silver paste or the like is used in formation of the collector electrode 62A and the like. In the envisaged case, gas permeability and water vapor permeability of the collector electrode 62A and the like may increase, moisture may infiltrate from holes of the collector electrode 62A and the like, and degradation of the solar cells may occur.

In response to the envisaged case described above, the holes 15A and 15B are formed in the protruding part 14 in the present embodiment, which is a different part to the electricity generating region 11, and the metal foils 13A and 13B providing electrical continuity with the collector electrodes 62A and 62B are exposed via the holes 15A and 15B. Consequently, the holes 15A and 15B that are in communication with the external atmosphere and the solar cells 12a can be sufficiently separated through the filling member 61a in the present embodiment. Moreover, the metal foils 13A and 13B that are exposed via the holes 15A and 15B have low gas permeability and water vapor permeability. This can prevent infiltration of moisture to the electricity generating region 11b in the present embodiment. Accordingly, degradation of the solar cells 12a in the electricity generating region 11b can be prevented in the present embodiment even in a case in which a material having high gas permeability and water vapor permeability is used for the collector electrode 62A and the like.

Other effects and configurations of the energy harvesting section 10b according to the second embodiment are the same as for the energy harvesting sections 10 and 10a according to the first embodiment. Moreover, the modified examples described in the first embodiment can also be adopted in the second embodiment.

Third Embodiment

Figure 16:
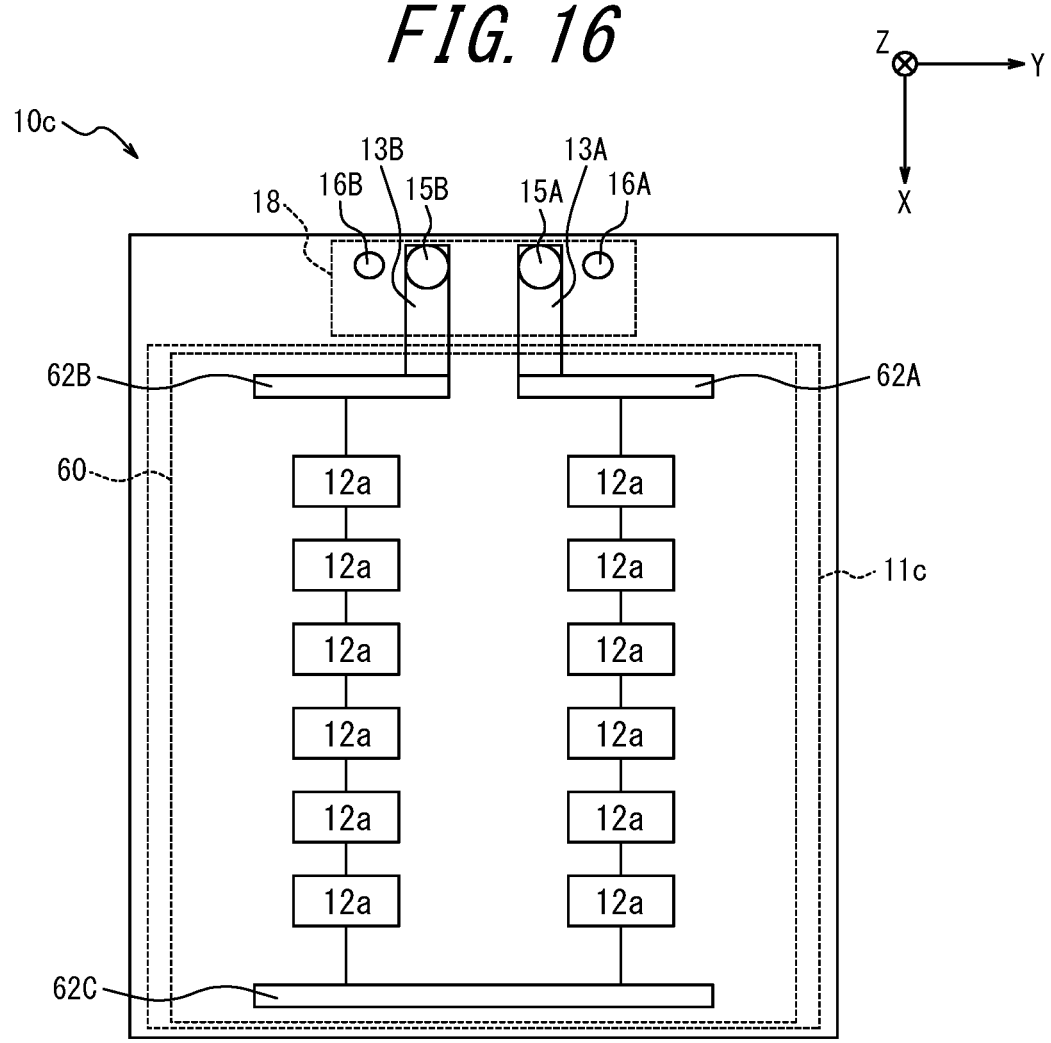
FIG. 16 illustrates schematic configuration of an energy harvesting section according to a third embodiment of the present disclosure.

The following describes a third embodiment with reference to FIG. 16. The third embodiment differs from the previously described first and second embodiments in terms of the shape of the energy harvesting section.

FIG. 16 illustrates schematic configuration of an energy harvesting section according to the third embodiment of the present disclosure.

The energy harvesting section 10c includes an electricity generating region 11c, metal foils 13A and 13B, and a region 18.

Note that the term "peripheral part of the energy harvesting section" as used in the present specification refers to an edge part at a side located at the negative X-axis direction side of the energy harvesting section as previously described. In the third embodiment, the "peripheral part of the energy harvesting section 10c" is included in the region 18. Note that the "peripheral part of the energy harvesting section 10c" may be the entire region 18 or may be a negative X-axis direction portion of the region 18. In the following description, the "peripheral part of the energy harvesting section 10c" is considered to be the entire region 18.

The region 18 includes a pair of holes 15A and 15B. Moreover, in a case in which an energy harvester including the energy harvesting section 10c includes the first housing 30 and the second housing 40 that were previously described in the first embodiment, for example, the region 18 may include a pair of first through holes 16A and 16B. Note that the number of holes included in the region 18 in FIG. 16 is two (i.e., holes 15A and 15B). However, the number of holes included in the region 18 is not limited to this number. The number of holes included in the region 18 may alternatively be three or more. Although the holes 15A and 15B are formed in a surface at a negative Z-axis direction side of the region 18 (for example, a front surface) in FIG. 16, the holes 15A and 15B may be formed in a surface at a positive Z-axis direction side of the region 18 (for example, a rear surface). Moreover, the number of first through holes included in the region 18 in FIG. 16 is two (i.e., first through holes 16A and 16B). However, the number of first through holes included in the region 18 is not limited to this number. The number of first through holes included in the region 18 may alternatively be three or more.

The flat plate part 23A of the connector 20A and the flat plate part 23B of the connector 20B illustrated in FIG. 5 are arranged in the region 18. In other words, the region 18 in the third embodiment is a peripheral part and is also an arrangement region in which the flat plate parts 23A and 23B of the connectors 20A and 20B illustrated in FIG. 5 are arranged.

Other effects and configurations of the energy harvesting section 10c according to the third embodiment are the same as for the energy harvesting sections 10 and 10a according to the first embodiment and the energy harvesting section 10b according to the second embodiment. Moreover, the modified examples described in the first embodiment can also be adopted in the third embodiment.

Fourth Embodiment

The following describes an energy harvester 1j according to a fourth embodiment of the present disclosure with reference to FIGS. 17 to 21. The fourth embodiment mainly differs from the first embodiment in terms that the energy harvester 1j according to the fourth embodiment includes a flexible printed circuit 70.

Figure 17:
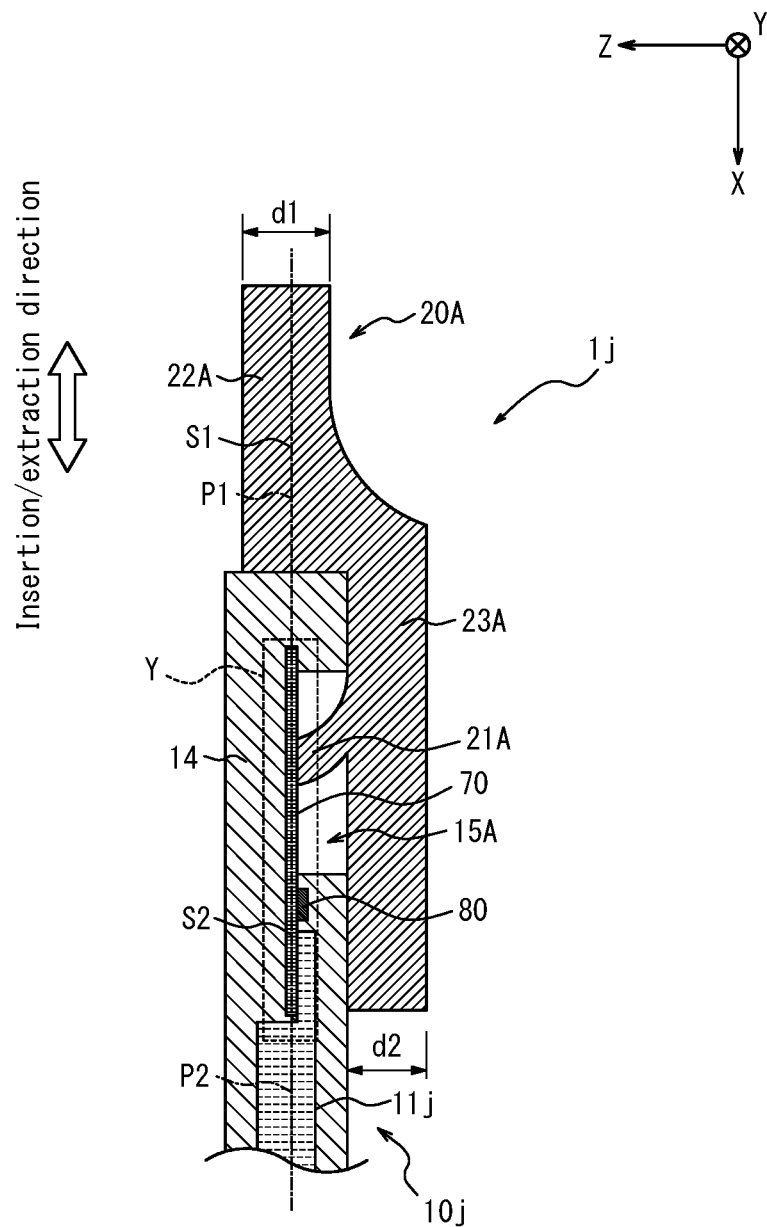
FIG. 17 is a cross-sectional view of an energy harvester according to a fourth embodiment of the present disclosure.
Figure 18:
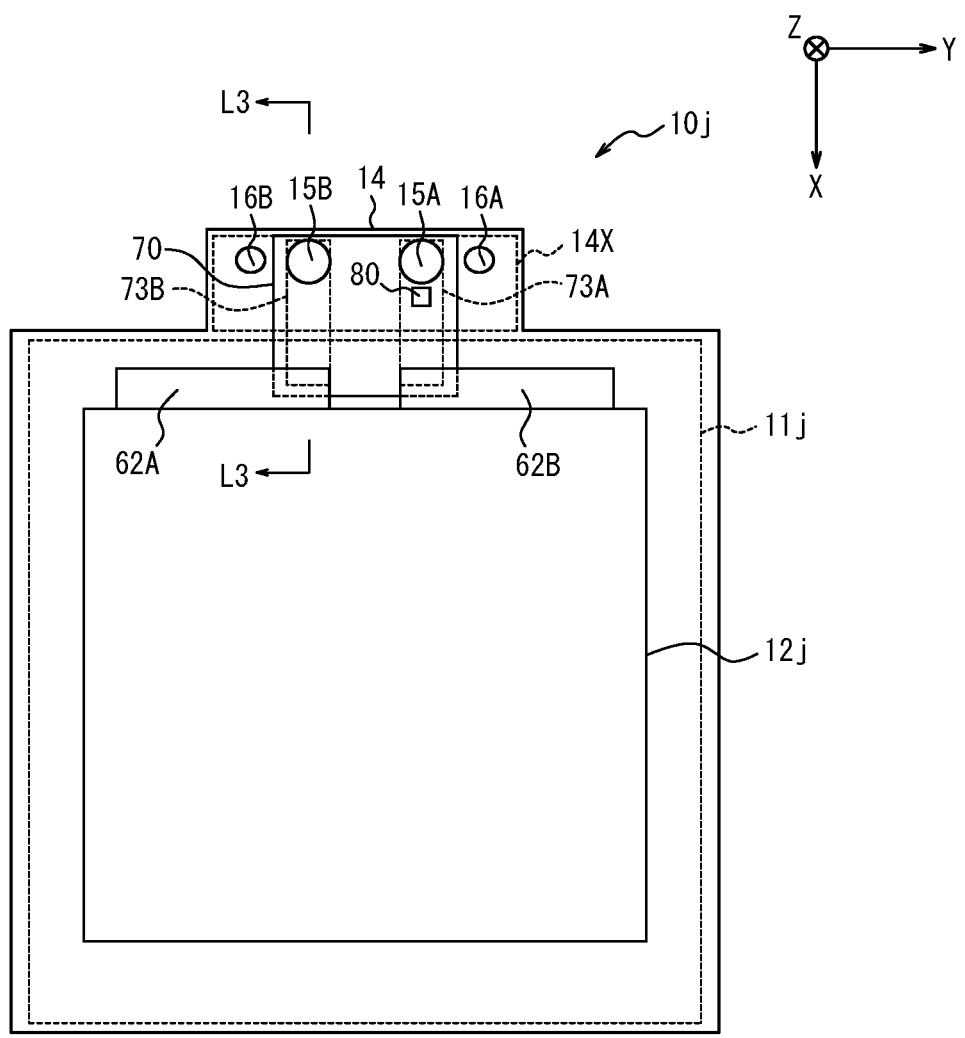
FIG. 18 illustrates schematic configuration of an energy harvesting section illustrated in FIG. 17.
Figure 19:
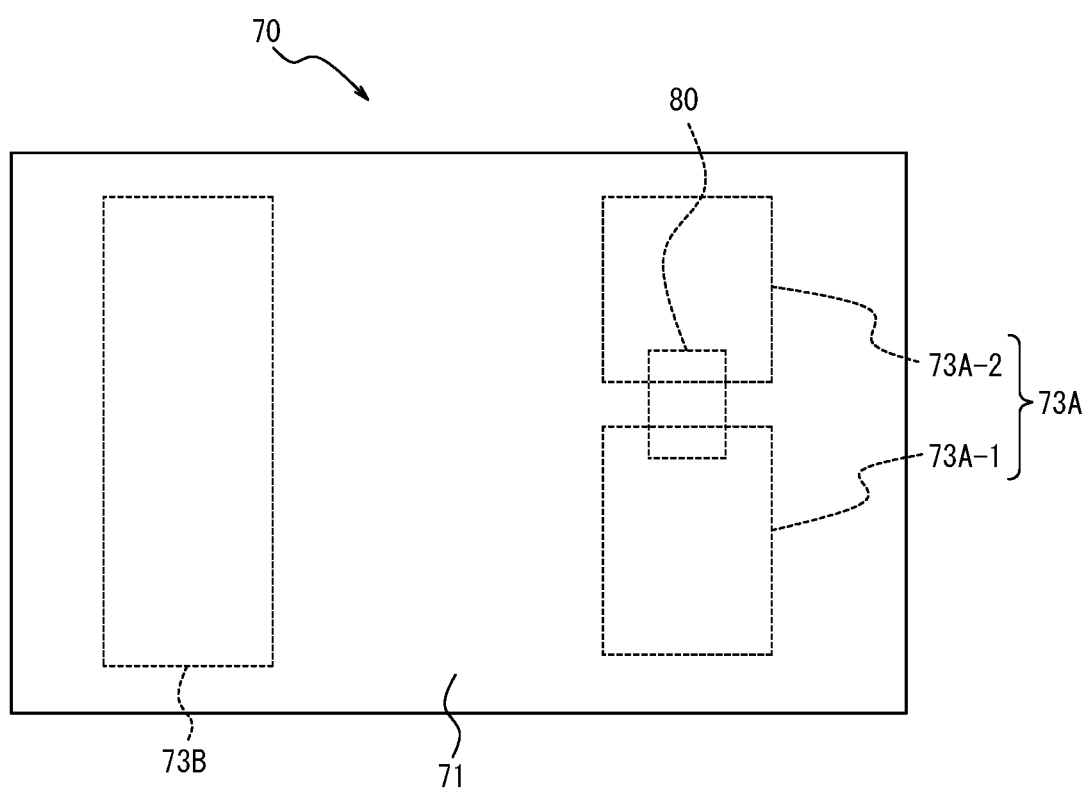
FIG. 19 is a plan view of a flexible printed circuit illustrated in FIG. 17.
Figure 20:
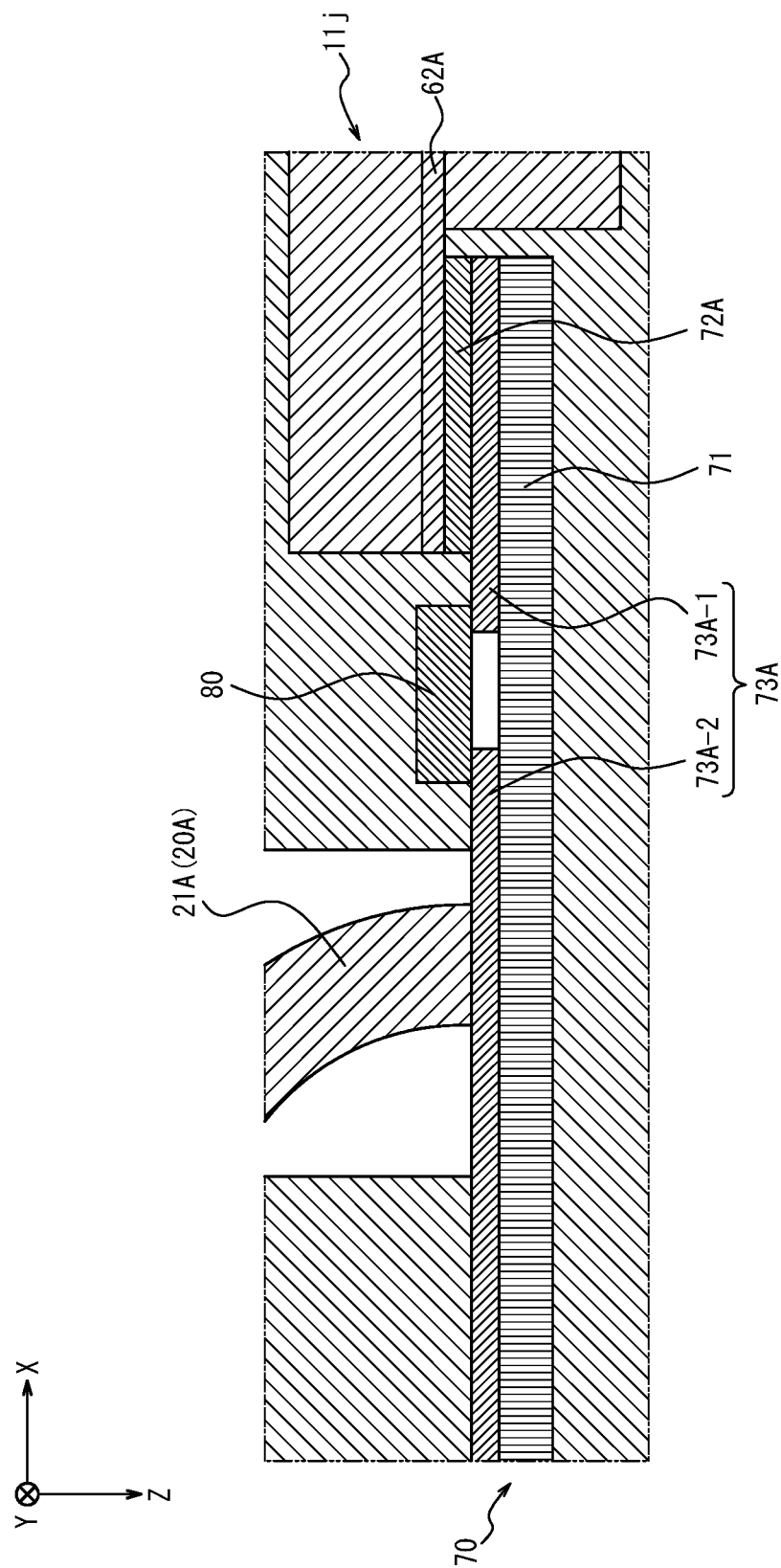
FIG. 20 is an enlarged view of a dotted line section Y, illustrated in FIG. 17, of the energy harvester according to the fourth embodiment of the present disclosure.
Figure 21:
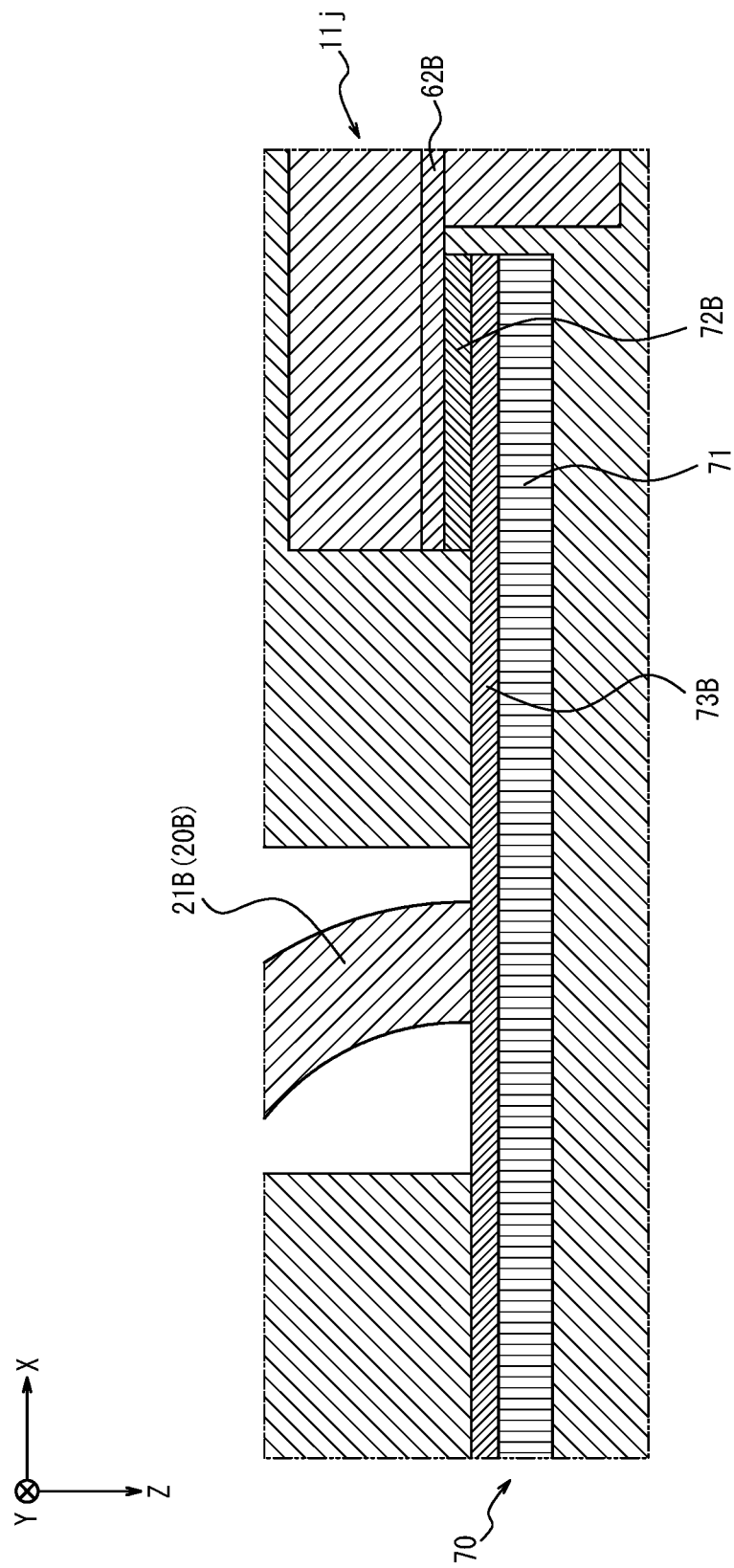
FIG. 21 is an enlarged view of another section of the energy harvester according to the fourth embodiment of the present disclosure.

FIG. 17 is a cross-sectional view of the energy harvester 1j according to the fourth embodiment of the present disclosure. The cross-sectional view illustrated in FIG. 17 corresponds to the cross-sectional view illustrated in FIG. 3. FIG. 18 illustrates schematic configuration of an energy harvesting section 10j illustrated in FIG. 17. FIG. 19 is a plan view of a flexible printed circuit 70 illustrated in FIG. 17. Note that the position of a diode 80 is indicated by a dashed line in FIG. 19. FIG. 20 is an enlarged view of a dotted line section Y, illustrated in FIG. 17, of the energy harvester 1j according to the fourth embodiment of the present disclosure. FIG. 21 is an enlarged view of another section of the energy harvester 1j according to the fourth embodiment of the present disclosure. FIG. 21 corresponds to a cross-sectional view of the energy harvester 1j at an L3-L3 line illustrated in FIG. 18.

The energy harvester 1j includes an energy harvesting section 10j and a flexible printed circuit (FPC) 70 as illustrated in FIGS. 17 and 18. The energy harvester 1j also includes a pair of connectors 20A and 20B in the same way as the energy harvester 1 illustrated in FIG. 2. In addition, the energy harvester 1j may include a diode 80 as illustrated in FIGS. 17 and 18. Also note that depending on the application of the energy harvester 1j, the energy harvester 1j may include a first housing 30 and a second housing 40 in the same way as the energy harvester 1 illustrated in FIG. 2.

The energy harvesting section 10j includes an electricity generating region 11j and a protruding part 14 as illustrated in FIG. 18. Note that in the fourth embodiment, a case is described in which a "peripheral part of the energy harvesting section 10j" is considered to be the entire protruding part 14 in the same way as in the first embodiment.

The electricity generating region 11j includes an electricity generating part 12j and collector electrodes 62A and 62B. The electricity generating part 12j may include the previously described solar cells 12a illustrated in FIG. 14. However, the configuration of the electricity generating part 12j is not limited to this configuration. In the same way as the previously described electricity generating part 12, the electricity generating part 12j may include a piezoelectric element that converts vibration to electrical power or may include a thermoelectric element that converts heat to electrical power. In a case in which the electricity generating part 12j includes the solar cells 12a, the electricity generating region 11j may include the previously described collector electrode 62C illustrated in FIG. 14 in addition to the collector electrodes 62A and 62B.

The flexible printed circuit 70 illustrated in FIGS. 18 and 19 is flexible. The flexible printed circuit 70 may have a flat plate shape. Also, the flexible printed circuit 70 may have a single-layer structure or a multi-layer structure. The flexible printed circuit 70 is arranged in the protruding part 14 as illustrated in FIG. 18. The flexible printed circuit 70 also overlaps with part of each of the collector electrode 62A and the collector electrode 62B as illustrated in FIGS. 20 and 21.

The flexible printed circuit 70 may be a single plate-shaped member such as illustrated in FIG. 19. The flexible printed circuit 70 includes an insulating layer 71 and a pair of metal foils 73A and 73B as illustrated in FIGS. 19 to 21.

The insulating layer 71 may be formed from a resin such as polyimide. The insulating layer 71 may also be referred to as a base film. The metal foil 73A is arranged at a section at a positive Y-axis direction side of the insulating layer 71 as illustrated in FIG. 20. The metal foil 73B is arranged at a section at a negative Y-axis direction side of the insulating layer 71 as illustrated in FIG. 21.

A connecting member 72A illustrated in FIG. 20 may be an electrically conductive member such as a conductive adhesive. The connecting member 72A is arranged at one end part of the metal foil 73A (for example, one end part of a first metal foil 73A-1). The connecting member 72A electrically connects the collector electrode 62A and the one end part of the metal foil 73A.

A connecting member 72B illustrated in FIG. 21 may be an electrically conductive member such as a conductive adhesive. The connecting member 72B is arranged at one end part of the metal foil 73B. The connecting member 72B electrically connects the collector electrode 62B and the one end part of the metal foil 73B.

The metal foils 73A and 73B illustrated in FIG. 18 are each, for example, a metal in the form of a foil having a thickness of 300 μm or less. The metal foils 73A and 73B may be copper foils.

One end part of the metal foil 73A is electrically connected to the collector electrode 62A via the connecting member 72A as illustrated in FIG. 20. Another end part of the metal foil 73A is exposed via a hole 15A as illustrated in FIG. 18. The other end part of the metal foil 73A that is exposed via the hole 15A is electrically connected to a spring 21A of the connector 20A.

One end part of the metal foil 73B is electrically connected to the collector electrode 62B via the connecting member 72B as illustrated in FIG. 21. Another end part of the metal foil 73B is exposed via a hole 15B as illustrated in FIG. 18. The other end part of the metal foil 73B that is exposed via the hole 15B is electrically connected to a spring 21B of the connector 20B.

In a case in which the energy harvester 1j includes a diode 80, the metal foil 73A may include a first metal foil 73A-1 and a second metal foil 73 A-2.

One end part of the first metal foil 73A-1 is electrically connected to the collector electrode 62A, for example, at the positive electrode side of the electricity generating region 11j, via the connecting member 72A, as illustrated in FIG. 20. Another end part of the first metal foil 73A-1 is electrically connected to an anode of the diode as illustrated in FIG. 20.

One end part of the second metal foil 73A-2 is electrically connected to a cathode of the diode 80 as illustrated in FIG. 20. Another end part of the second metal foil 73A-2 is exposed via the hole 15A and is electrically connected to the spring 21A of the connector 20A as illustrated in FIG. 20.

The diode 80 is arranged on the flexible printed circuit 70 as illustrated in FIGS. 18 and 19. The diode 80 is, for example, arranged at a surface that, among two surfaces included in the protruding part 14 that are roughly parallel to an XY-plane, is a surface positioned at the negative Z-axis direction side as illustrated in FIG. 18.

The anode of the diode 80 is electrically connected to the collector electrode 62A via the first metal foil 73A-1 and the connecting member 72A as illustrated in FIG. 20. The cathode of the diode 80 is electrically connected to the spring 21A of the connector 20A via the second metal foil 73A-2. This configuration can prevent the flow of current into the electricity generating region 11j via the connector 20A and the collector electrode 62A from an external device or the like.

In this manner, the energy harvester 1j according to the fourth embodiment includes a diode 80 arranged on a flexible printed circuit 70. By arranging the diode 80 on the flexible printed circuit 70 in the fourth embodiment, the degree of freedom of arrangement position of the diode 80 can be increased. Increasing the degree of freedom of arrangement position of the diode 80 in the fourth embodiment enables size reduction of the energy harvester 1j.

Other effects and configurations of the energy harvester 1j according to the fourth embodiment are the same as for the energy harvester 1 according to the first embodiment. In other words, it is also the case for the energy harvester 1j according to the fourth embodiment that a flat plate part 23A of the connector 20A and a flat plate part 23B of the connector 20B overlap with the peripheral part of the flat plate-shaped energy harvesting section 10j and that the energy harvesting section 10j and the connectors 20A and 20B are unified. Consequently, an increase in thickness of the energy harvester 1j can be suppressed and the energy harvester 1j can be provided with excellent portability. Moreover, when the energy harvesting section 10j and the connectors 20A and 20B are unified and fixed together, the springs 21A and 21B of the connectors 20A and 20B are pressed against by the metal foils 73A and 73B of the flexible printed circuit 70. Consequently, contact strength between the springs 21A and 21B and the metal foils 73A and 73B can be increased, and reliability of conductive connection between the energy harvesting section 10j and the connectors 20A and 20B can be increased.

The modified examples described in the first embodiment can also be adopted in the energy harvester 1j according to the fourth embodiment. Moreover, the energy harvester 1j according to the fourth embodiment may include the energy harvesting section 10b according to the second embodiment or the energy harvesting section 10c according to the third embodiment instead of the energy harvesting section 10.

The above merely describes illustrative embodiments of the present disclosure and it goes without saying that various alterations may be made within the scope of the claims.

For example, a configuration in which the collector electrodes 62A to 62C contain silver was described in the second embodiment and the third embodiment. However, the collector electrodes 62A to 62C may contain a metal other than silver. For example, the collector electrodes 62A to 62C may be metal foils that are connected by a conductive adhesive or the like on one of the electrode base plates 60. In this case, the collector electrodes 62A to 62C may be the same types of metal foils as the metal foils 13A and 13B. Through this configuration, the collector electrode 62A and the metal foil 13A can be formed as a unified body. Likewise, the collector electrode 62B and the metal foil 13B can be formed as a unified body. Consequently, the production process can be simplified.

Figure 22:
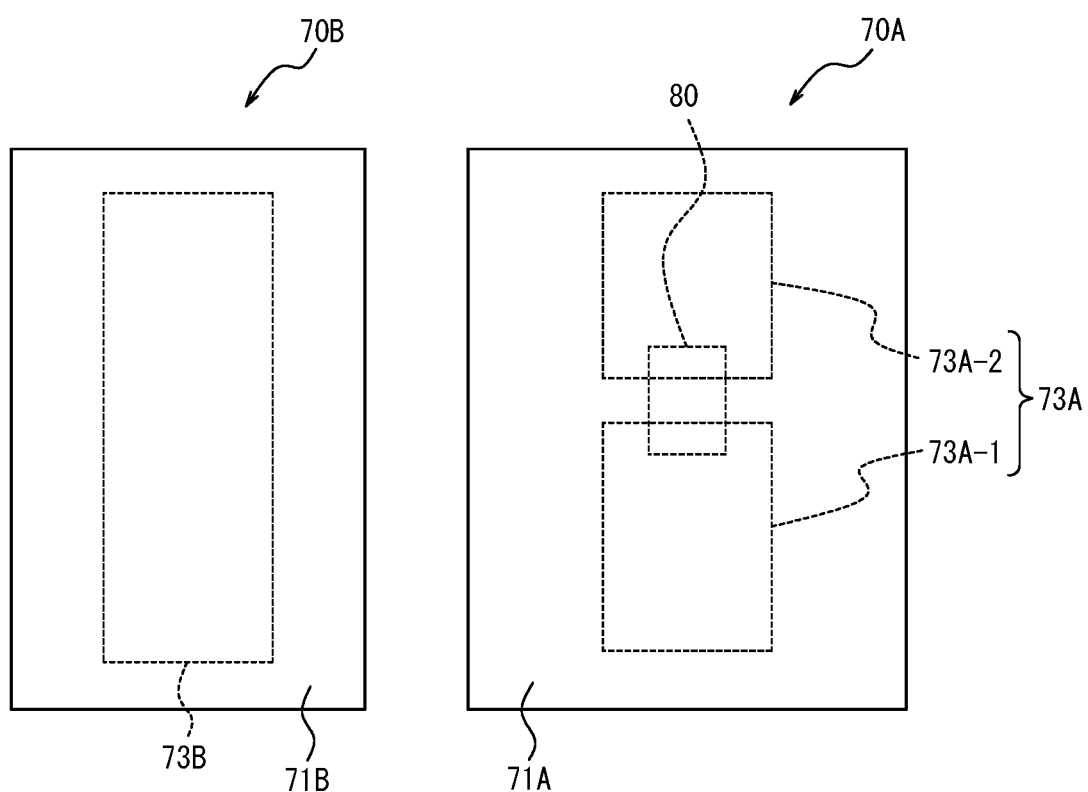
FIG. 22 is a plan view illustrating another example of a flexible printed circuit.

In the fourth embodiment, an example was described in which the flexible printed circuit 70 was taken to be a single plate-shaped member as illustrated in FIG. 19. However, the flexible printed circuit 70 is not limited to a single plate-shaped member. For example, two flexible printed circuits 70A and 70B may be used as illustrated in FIG. 22. The flexible printed circuit 70A illustrated in FIG. 22 includes an insulating layer 71A and a metal foil 73A. The flexible printed circuit 70B illustrated in FIG. 22 includes an insulating layer 71B and a metal foil 73B. The insulating layers 71A and 71B may be formed from the same type of material as the insulating layer 71 illustrated in FIG. 19.

INDUSTRIAL APPLICABILITY

According to the present disclosure, it is possible to provide an energy harvester having excellent portability.

REFERENCE SIGNS LIST 1, 1a-1j energy harvester
10, 10a, 10b, 10c, 10j energy harvesting section
11, 11b, 11c, 11j electricity generating region
12, 12j electricity generating part
12a solar cell
13A, 13B metal foil
14 protruding part
14X arrangement region
15A, 15B hole
16A, 16B first through hole
17A, 17B notch
18 region
20A, 20B connector
21A, 21B spring
22A, 22B terminal part
23A, 23B flat plate part
24A, 24B second through hole
25 electrical insulator
30, 30a, 30d, 30e, 30f first housing
31A, 31B projecting part
32A, 32B depressed part
33 protrusion
34A, 34B region
35 cavity
40, 40a, 40b, 40c, 40d, 40e, 40f, 40g second housing
41A, 41B fitting part
42A, 42B, 43 depressed part
44A, 44B side wall part
45 protruding part
46 ridge part
47A, 47B opening
50A, 50B magnet
60 electrode base plate
61a filling member
61b exterior member
62A, 62B, 62C collector electrode
70, 70A, 70B flexible printed circuit
71A, 71B insulating layer
72A, 72B connecting member
73A, 73B metal foil
73A-1 first metal foil
73A-2 second metal foil
80 diode
100, 100a female connector
101 positive electrode terminal
102 negative electrode terminal
103 electrically insulating part

The invention claimed is:

1. An energy harvester comprising:
an energy harvesting section having a flat plate shape; and
a pair of connectors that are electrically conductive, wherein
the energy harvesting section includes:
an electricity generating region that utilizes energy in an external environment to generate electrical power;

a pair of metal foils that extend from the electricity generating region to a peripheral part of the energy harvesting section and to which the electrical power is supplied; and a flexible printed circuit including the pair of metal foils, the peripheral part includes a pair of holes that expose part of each of the metal foils, each of the connectors includes:
   a spring that is electrically connected to a corresponding one of the metal foils exposed via a corresponding one of the holes;
   a terminal part that is electrically connected to the spring and that is connectable to an external device; and
   a flat plate part that overlaps with the energy harvesting section, the energy harvester further comprises a diode arranged on the flexible printed circuit, one of the metal foils includes a first metal foil and a second metal foil, one end part of the first metal foil is electrically connected to a positive electrode side of the electricity generating region and another end part of the first metal foil is electrically connected to an anode of the diode, and one end part of the second metal foil is electrically connected to a cathode of the diode and another end part of the second metal foil is exposed via the corresponding one of the holes and is electrically connected to the spring.

2. The energy harvester according to claim 1, wherein the energy harvesting section includes, separately to the electricity generating region, an arrangement region in which the flat plate part is arranged.

3. The energy harvester according to claim 1, wherein the peripheral part is included in a protruding part that protrudes from the electricity generating region.

4. The energy harvester according to claim 1, wherein the spring, the terminal part, and the flat plate part are formed as a unified body.

5. The energy harvester according to claim 1, wherein the terminal part has a larger thickness than the flat plate part.

6. The energy harvester according to claim 1, wherein a plane that passes along a center line of a thickness direction of the terminal part and is perpendicular to the thickness direction and a plane that passes along a center line of a thickness direction of the energy harvesting section and is perpendicular to the thickness direction roughly coincide.

7. The energy harvester according to claim 1, wherein a surface that passes through a center of gravity of the energy harvesting section having a flat plate shape and is roughly parallel to the energy harvesting section and a surface that passes through a center of gravity of the terminal part and is perpendicular to a thickness direction of the terminal part are roughly the same.

8. The energy harvester according to claim 1, wherein, in a cross-section that is roughly parallel to an insertion/extraction direction in which the terminal part is inserted or extracted and is perpendicular to the energy harvesting section having a flat plate shape, a center line of a thickness direction of the terminal part and a center line of a thickness direction of the energy harvesting section roughly coincide and are roughly parallel to the insertion/extraction direction.

9. The energy harvester according to claim 1, wherein a surface that passes through a center of gravity of the energy harvesting section having a flat plate shape and is roughly parallel to the energy harvesting section and a surface that passes through a center of gravity of the terminal part and is perpendicular to a thickness direction of the terminal part are roughly the same and are roughly parallel to an insertion/extraction direction in which the terminal part is inserted or extracted.

10. An energy harvester comprising:
an energy harvesting section having a flat plate shape;
a pair of connectors that are electrically conductive,
a first housing including a pair of projecting parts; and
a second housing including a pair of fitting parts into which the projecting parts respectively fit, wherein
the energy harvesting section includes:
   an electricity generating region that utilizes energy in an external environment to generate electrical power; and
   a pair of metal foils that extend from the electricity generating region to a peripheral part of the energy harvesting section and to which the electrical power is supplied,
the peripheral part includes a pair of holes that expose part of each of the metal foils, and
each of the connectors includes:
   a spring that is electrically connected to a corresponding one of the metal foils exposed via a corresponding one of the holes;
   a terminal part that is electrically connected to the spring and that is connectable to an external device; and
   a flat plate part that overlaps with the energy harvesting section,
the first housing and the second housing sandwich the peripheral part and the connectors,
the peripheral part includes a pair of first penetrations through which the projecting parts are respectively inserted, and
the flat plate part includes a second penetration through which a corresponding one of the projecting parts is inserted.

11. The energy harvester according to claim 10, wherein at least one of the first housing and the second housing has a shape or member that is dependent on an external device.

12. The energy harvester according to claim 1, wherein an electrical insulator is arranged between the terminal parts of the connectors.

13. The energy harvester according to claim 1, wherein the electricity generating region includes a dye-sensitized solar cell.

* * * * *